(12) United States Patent
Limberg

(10) Patent No.: US 7,945,844 B2
(45) Date of Patent: May 17, 2011

(54) ROBUST DTV SIGNALS TRANSMITTED AT TWO THIRDS THE CODE RATE OF ORDINARY 8VSB DTV SIGNALS

(76) Inventor: Allen LeRoy Limberg, Port Charlotte, FL (US)

(*) Notice: Subject to any disclaimer, the term of this patent is extended or adjusted under 35 U.S.C. 154(b) by 1054 days.

(21) Appl. No.: 11/785,000

(22) Filed: Apr. 10, 2007

(65) Prior Publication Data

US 2008/0019466 A1   Jan. 24, 2008

Related U.S. Application Data

(60) Provisional application No. 60/802,687, filed on May 22, 2006.

(51) Int. Cl.
    *H03M 13/00*    (2006.01)
(52) U.S. Cl. ...................................................... 714/784
(58) Field of Classification Search .................. 714/751, 714/752, 784; 375/265
    See application file for complete search history.

(56) References Cited

U.S. PATENT DOCUMENTS 6,823,489 B2 * 11/2004 Wittig et al. .................. 714/792
7,111,221 B2 *  9/2006 Birru et al. .................... 714/755

* cited by examiner

*Primary Examiner* — Shelly A Chase

(57) ABSTRACT

Redundant coding of 8VSB digital television signals using (12, 8) linear block codes reduces code rate by a third. The parity bits for the (12, 8) block coding of the bytes in a pair of (207, 187) Reed-Solomon codewords are transmitted in a 207-byte segment of data. The information bits contained in each pair of (207, 187) Reed-Solomon codewords are subsequently transmitted in 207-byte segments of data that can be usefully received by legacy digital television receivers. A preferred (12, 8) linear block coding is the equivalent of Gray coding followed by rearranged shortened (15, 11) Hamming coding followed by Gray decoding. Digital television transmitter apparatus capable of generating such redundantly coded signal is described. So is digital television receiver apparatus capable of receiving and decoding such redundantly coded signal to secure more robust reception.

17 Claims, 19 Drawing Sheets

Fig. 3

| POSITION | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| BINARY NO. | 0001 | 0010 | 0011 | 0100 | 0101 | 0110 | 0111 | 1000 | 1001 | 1010 | 1011 | 1100 | 1101 | 1110 | 1111 |
| $2^0$ CHECK EQ. | X |  | X |  | X |  | X |  | X |  | X |  | X |  | X |
| $2^1$ CHECK EQ. |  | X | X |  |  | X | X |  |  | X | X |  |  | X | X |
| $2^2$ CHECK EQ. |  |  |  | X | X | X | X |  |  |  |  | X | X | X | X |
| $2^3$ CHECK EQ. |  |  |  |  |  |  |  | X | X | X | X | X | X | X | X |

Fig. 4

| NEW POSITION | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| OLD POSITION | 1 | 2 | 4 | 8 | 3 | 5 | 6 | 7 | 9 | 10 | 11 | 12 | 13 | 14 | 15 |
| BINARY NO. | 0001 | 0010 | 0100 | 1000 | 0011 | 0101 | 0110 | 0111 | 1001 | 1010 | 1011 | 1100 | 1101 | 1110 | 1111 |
| $2^0$ CHECK EQ. | X |  |  |  | X | X |  | X | X |  | X |  | X |  | X |
| $2^1$ CHECK EQ. |  | X |  |  | X |  | X | X |  | X | X |  |  | X | X |
| $2^2$ CHECK EQ. |  |  | X |  |  | X | X | X |  |  |  | X | X | X | X |
| $2^3$ CHECK EQ. |  |  |  | X |  |  |  |  | X | X | X | X | X | X | X |

| MSB & LSB GRAY CODE | 00 | 00 | 01 | 01 | 11 | 11 | 10 | 10 |
|---|---|---|---|---|---|---|---|---|
| MSB & 2MSB A/53 SYMBOL | 00 | 00 | 01 | 01 | 10 | 10 | 11 | 11 |

Fig. 7

| NEW POSITION | 1 | 2 | 3 | 4 | 5 | 6 | 7 | 8 | 9 | 10 | 11 | 12 |
|---|---|---|---|---|---|---|---|---|---|---|---|---|
| OLD POSITION | 1 | 2 | 4 | 8 | 3 | 5 | 9 | 10 | 11 | 12 | 13 | 15 |
| BINARY NO. | 0001 | 0010 | 0100 | 1000 | 0011 | 0101 | 1001 | 1010 | 1011 | 1100 | 1101 | 1111 |
| $2^0$ CHECK EQ. | X |   |   |   | X | X | X |   | X |   | X | X |
| $2^1$ CHECK EQ. |   | X |   |   | X |   |   | X | X |   |   | X |
| $2^2$ CHECK EQ. |   |   | X |   |   | X |   |   |   | X | X | X |
| $2^3$ CHECK EQ. |   |   |   | X |   |   | X | X | X | X | X | X |

Fig. 5

| NEW POSITION | 1 | 2 | 3 | 4 | 5 | 6 | 7 | 8 | 9 | 10 | 11 | 12 |
|---|---|---|---|---|---|---|---|---|---|---|---|---|
| OLD POSITION | 1 | 2 | 4 | 8 | 3 | 5 | 6 | 7 | 10 | 12 | 14 | 15 |
| BINARY NO. | 0001 | 0010 | 0100 | 1000 | 0011 | 0101 | 0110 | 0111 | 1010 | 1100 | 1110 | 1111 |
| $2^0$ CHECK EQ. | X |   |   |   | X | X |   | X |   |   |   | X |
| $2^1$ CHECK EQ. |   | X |   |   | X |   | X | X | X |   | X | X |
| $2^2$ CHECK EQ. |   |   | X |   |   | X | X | X |   | X | X | X |
| $2^3$ CHECK EQ. |   |   |   | X |   |   |   |   | X | X | X | X |

Fig. 6

ROBUST DTV SIGNALS TRANSMITTED AT TWO THIRDS THE CODE RATE OF ORDINARY 8VSB DTV SIGNALS

This application filed under 35 U.S.C. 111 (a) claims pursuant to 35 U.S.C. 119(e)(1) the benefit of the filing date of U.S. patent application Ser. No. 60/802,687 filed 22 May 2006 pursuant to 35 U.S.C. 111 (b).

This invention relates to the coding of digital signals, such as those used for broadcasting digital television.

BACKGROUND OF THE INVENTION

Annex D of the "ATSC Digital Television Standard" was published by the Advanced Television Systems Committee (ATSC) in September 1995 as its document A/53. This standard defined the broadcasting of digital television (DTV) signals within the United States of America and is referred to in this specification simply as "A/53". A/53 specifies a vestigial-sideband amplitude-modulation signal in which the digital symbols are transmitted by eight-level modulation known as 8VSB, which has −7, −5, −3, −1, +1, +3, +5 and +7 normalized modulation signal values. The digital symbols are subjected to 2/3 trellis coding. The transmission of more robust DTV signals at one-half or one-quarter the code rate of ordinary 8VSB signals subsequently became a subject of interest at the beginning of the twenty-first century.

Such transmissions entailed sacrifices of so much channel capacity that apparently most broadcasters have subsequently judged them not to be viable from a business standpoint. Furthermore, proposed systems for transmitting more robust DTV signals at one-half or one-quarter the code rate of ordinary 8VSB signals have attempted to limit these transmissions to windows of 184-byte duration in the 207-byte segments of data fields. This limitation leads to the transport stream multiplexer in a DTV transmitter becoming so complex as to be impractical.

Previously, as documented in U.S. patent application Ser. No. 11/724,364 filed 15 Mar. 2007 and titled "ROBUST DTV SIGNALS THAT CAN OVERCOME BURST ERRORS UP TO 1040 BYTES OR MORE IN LENGTH", as well as in the similarly titled provisional U.S. patent application Ser. No. 60/782,481 filed 15 Mar. 2006, the inventor solved the problem concerning the transport stream multiplexer being too complex to be practical. The 207 bytes of a (207, 187) Reed-Solomon codeword to be transmitted at the code rate of ordinary 8VSB signal occupy just a single segment of a data field. The RS codeword is convolutionally interleaved to separate its bytes so that they occur at 52-byte intervals in the convolutional interleaved signal supplied for trellis encoding that reduces code rate by a factor of 2/3. This spreads the RS codeword over fifty-two 207-byte segments of a convolutionally interleaved data field. The inventor discerned that a (207, 187) Reed-Solomon codeword to be transmitted at a code rate one-half that of ordinary 8VSB signal would occupy exactly two 207-byte segments of a data field before convolutional interleaving. By including the initial half of the codeword fifty-two 207-byte segments of a data field earlier than its final half, subsequent convolutional interleaving spreads the RS codeword over one hundred four 207-byte segments of the convolutionally interleaved data field. The inventor further discerned that a (207, 187) Reed-Solomon codeword to be transmitted at a code rate one-quarter that of ordinary 8VSB signal would occupy exactly four 207-byte segments of a data field before convolutional interleaving. By beginning the four segments at 52-data-segment intervals, subsequent convolutional interleaving spreads the RS codeword over two hundred eight 207-byte segments of the convolutionally interleaved data field. Accordingly, the operation of the transport stream multiplexer in the transmitter only needs to take into account a duration somewhat shorter than a single data field time, rather than the duration of many data fields. So, the data memory required to support transport stream multiplexing can be reduced to practical size.

In U.S. patent application Ser. No. 11/119,662 filed 2 May 2005 and titled "DIGITAL TELEVISION SIGNALS USING LINEAR BLOCK CODING" the inventor described the use of linear block codes for halving the code rate of DTV signals. In U.S. patent application Ser. No. 11/724,364 the inventor described the separation of the parity bits of systematic linear block codes from the information bits, so that (207, 187) Reed-Solomon codewords containing just the information bits could be usefully received by legacy DTV receivers. Patent application Ser. No. 11/724,364 indicated the systematic linear block codes were preferably an (8, 4) extended Hamming code or a (16, 8) code derived therefrom. These linear block codes can locate erroneous bytes for the (207, 187) Reed-Solomon forward-error-correction coding, which permits a decoding algorithm to be used that can correct up to twenty erroneous bytes. D. A. Luthi disclosed this decoding algorithm in U.S. Pat. No. 5,875,199 issued 23 Feb. 1999 and titled "Video Device with Reed-Solomon Erasure Decoder and Method Thereof".

Apparently, transmitting robust signals within just a 184-byte window in each 207-byte data segment was done to accommodate legacy receivers identifying the PIDs of the packets containing robust signals as PIDs not associated with ordinary 8VSB transmissions. So the legacy receivers can do this accurately, the packets are Reed-Solomon-coded. This approach presents an 11.1% cost in overhead, before the information code rate is reduced.

It is not necessary to use PIDs to make legacy DTV receivers disregard a data segment. If one wants legacy DTV receivers to disregard a data segment, all that is necessary is that the data segment not be a correct or correctable (207, 187) Reed-Solomon codeword. The data segment will then be discarded in the transport stream de-multiplexing process of a legacy DTV receiver. Data are subject to randomization by exclusive-ORing them with a prescribed pseudo-random binary sequence. So, if a segment of robust data undesirably appears to be a correct or correctable (207, 187) RS codeword for ordinary 8VSB, often simply sending the data during different data-segment intervals can cure the problem. However, this complicates the transport stream multiplexer.

Rather than moving the data to a different data-segment interval, twenty or so selected bytes of each 207-byte chunk can be modified in a prescribed way before transmission, so the chunk will not be mistaken for be a correct or correctable (207, 187) RS codeword. The 207-byte chunk can then be restored after reception. The overhead required to send information concerning which segments are modified is less than a percent. Furthermore, trial-and-error RS decoding will allow the 207-byte chunks to be restored after reception without having to receive specific other information about the modifications.

High-definition-television (HDTV) signals can be satisfactorily transmitted using somewhat less than two-thirds the capacity of the DTV channel. The (15, 11) Hamming code can be shortened to a (12, 8) cyclical linear code, capable of arrangement as a systematic code in which the original information bits appear in their original order. The (12, 8) cyclical linear code can be used to reduce code rate to two-thirds the code rate of ordinary 8VSB signal. The inventor discerned that this permits a more robust transmission of the entire HDTV signal, which should be a viable commercial use of coding of a DTV signal to increase the redundancy therein. Furthermore, the inventor discerned, the parity bits for the linear coding of each successive non-overlapping pair of (207, 187) RS codewords could be transmitted in another 207-byte segment of data. This would permit legacy DTV receivers to receive the entire HDTV signal usefully, though not as robustly as a DTV receiver especially designed to utilize the redundant linear block coding of the HDTV signal. Alternatively, the same coding scheme could be applied to two or possibly three standard-definition-television (SDTV) signals. Still further, the same coding scheme could be applied just to selected portions of the television signal(s), such as the audio portion.

SUMMARY OF THE INVENTION

A principal aspect of the invention is the redundant coding of 8VSB digital television signals using (12, 8) linear block codes to reduce the code rate. Preferably, the information bits contained in each pair of (207, 187) Reed-Solomon codewords are transmitted in 207-byte segments of data that can be usefully received by legacy digital television receivers. The parity bits for the (12, 8) block coding of the bytes in each pair of (207, 187) Reed-Solomon codewords are then transmitted in another 207-byte segment of data. Digital television transmitter apparatus capable of generating such redundantly coded signal is a further aspect of the invention. Digital television receiver apparatus capable of receiving and decoding such redundantly coded signal to secure more robust reception is a still further aspect of the invention.

BRIEF DESCRIPTION OF THE DRAWING

FIG. 3 is a table showing the known check equations for a (15, 11) Hamming code.

FIG. 4 is a table showing the check equations for a rearranged (15, 11) Hamming code.

FIG. 5 is a table showing the check equations for a first particular (12, 8) linear code shortened from the re-arranged (15, 11) Hamming code of the FIG. 4 table, which first particular (12, 8) linear code can be employed in the (12, 8) linear block code encoder of FIG. 2.

FIG. 6 is a table showing the check equations for a second particular (12, 8) linear code shortened from the re-arranged (15, 11) Hamming code of the FIG. 10 table, which second particular (12, 8) linear code can alternatively be employed in the (12, 8) linear block code encoder of FIG. 2.

FIG. 7 shows is a table showing a representative Gray code that can be employed in the FIG. 8 (12, 8) linear block code encoder.

Interconnections shown in dotted line carry control signals. As one of ordinary skill in the art will understand, some of the interconnections will include respective shim delays.

DETAILED DESCRIPTION

Figure 1:
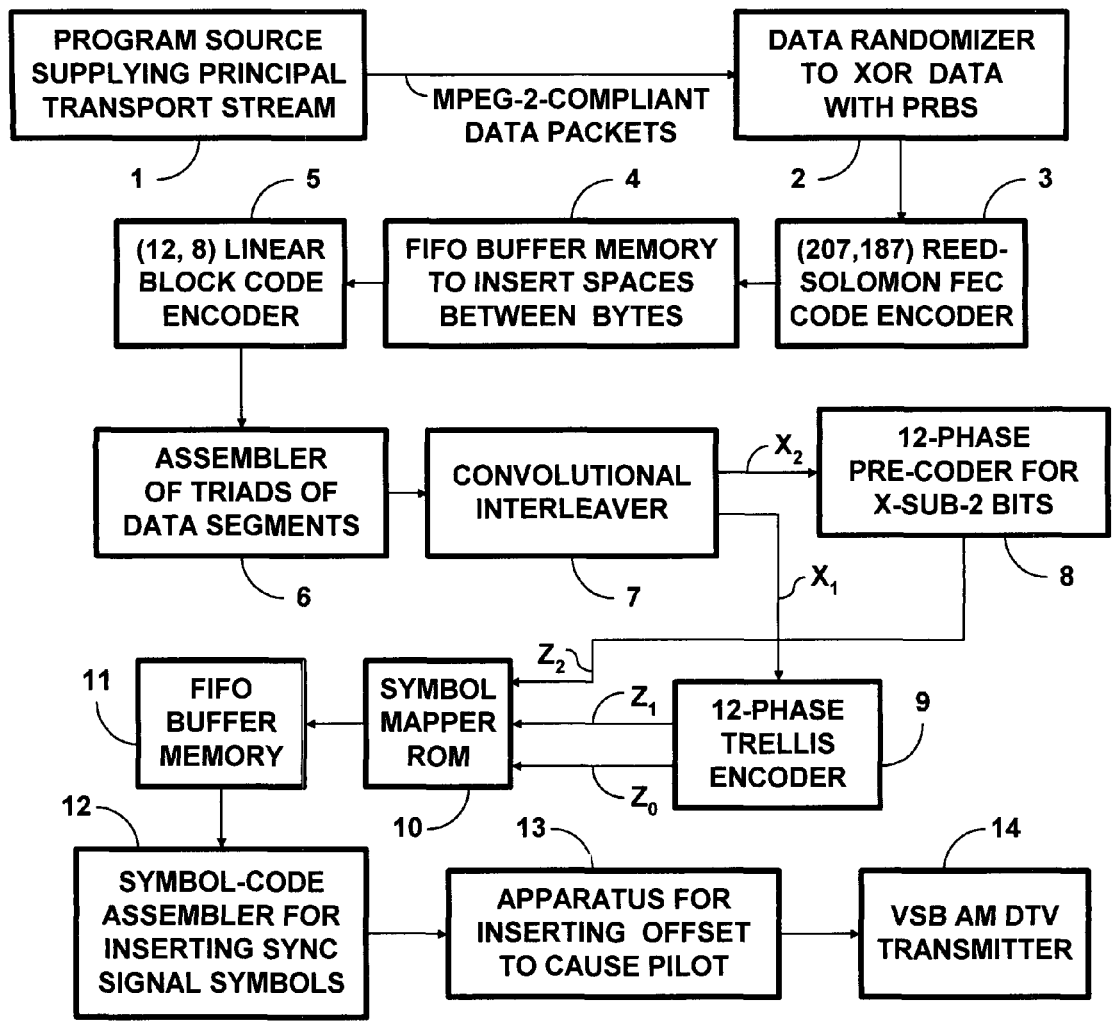
FIG. 1 is a schematic diagram of DTV transmitter apparatus embodying an aspect of the invention, which DTV transmitter apparatus provides additional coding of HDTV signals that can be usefully received by legacy DTV receivers as well as being better received by DTV receivers designed to take advantage of the additional coding.

FIG. 1 shows DTV transmitter apparatus for (12, 8) linear block coding DTV signals for subsequent transmission at two-thirds the code rate of ordinary 8VSB signals. In FIG. 1 a program source 1 of a principal transport stream is connected to supply the successive 187-byte data packets in that transport stream to a data randomizer 2. The principal transport stream comprises a succession of MPEG-2-compliant data packets descriptive of an HDTV signal or, alternatively, two or possibly three SDTV signals. The data randomizer 2 is operated for randomizing the bits in those data packets by exclusive-ORing those bits with the bits of a $2^{16}$-bit maximal length pseudo-random binary sequence (PRBS). The PRBS, which is initialized at the beginning of each data field, is that specified in A/53, Annex D, §§4.2.2 titled "Data randomizer". The portion of the PRBS used in exclusive-ORing each data segment is that portion which is suitable for the location of that data segment in the non-interleaved data field that will be assembled for subsequent (207, 187) Reed-Solomon forward-error-correction coding, convolutional interleaving and trellis coding.

An encoder 3 for generating (207, 187) Reed-Solomon forward-error-correction codewords is connected for receiving randomized 187-byte data packets from the data randomizer 2. The encoder 3 converts these randomized 187-byte data packets to respective 207-byte segments of (207, 187) RS FEC coding that appends the respective twenty parity bytes of the coding of each randomized 187-byte data packet after the conclusion thereof. The (207, 187) RS-FEC-code encoder 3 is conventional in nature; and the practice specified in A/53, Annex D, §§4.2.3 titled "Reed-Solomon encoder" is followed. The (207, 187) RS-FEC-code encoder 3 is connected for writing 207-byte segments of (207, 187) RS FEC coding to a first-in/first-out buffer memory 4 for temporary storage therein.

The FIFO buffer memory 4 is operated for inserting 4-bit-epoch spaces between successive bytes of the (207, 187) RS-FEC-code words read therefrom to a (12, 8) linear-block-code encoder 5. The LBC encoder 5 employs a (12, 8) systematic cyclic linear block code that is shortened from the (15, 11) Hamming code. In its code response the LBC encoder 5 appends 4 parity bits to each 8-bit byte in each (207, 187) RS-FEC-code word received from the FIFO buffer memory 4. The LBC encoder 5 is connected for serially supplying its 12-bit codewords to a data-segment-triad assembler 6 for assembling successive, non-overlapping triads of data segments. The first data segment of each triad is composed of the parity bits generated by the LBC encoder 5 responsive to the second and third data segments of that triad, which remain in a form that can ultimately be usefully received by legacy DTV receivers. All the bits in the final twenty bytes of the first data segment of each triad are complemented if and only if a legacy DTV receiver would mistake that segment for a correct or correctable (207, 187) RS-FEC-code word. The (12, 8) LBC encoder 5 and the data-segment-triad assembler 6 distinguish the FIG. 1 DTV transmitter apparatus from previously known DTV transmitter apparatus.

The output port of the assembler 6 is connected to the input port of a convolutional interleaver 7. The convolutional interleaver 7 responds to the successive bytes supplied from the assembler 6 to generate the successive data segments of an interleaved data field by convolutionally interleaving those bytes as prescribed by A/53, Annex D, §§4.2.4 titled "Interleaving".

A 12-phase precoder 8 is connected for receiving the $X_2$ bits of the convolutional interleaver 7 response and generating $Z_2$ bits by adding modulo-2 the $X_2$ bits with those bits from twelve symbol epochs previous. A 12-phase trellis encoder 9 is connected for receiving the $X_1$ bits of the convolutional interleaver 7 response and supplying them as $Z_1$ bits. The trellis encoder 9 is connected for supplying $Z_0$ bits that it generates dependent on previously received $X_1$ bits. A symbol mapper read-only memory 10 is connected for receiving $Z_2$ bits from the precoder 8 as a portion of its addressing input signal and for receiving the $Z_1$ and $Z_0$ bits from the trellis encoder 9 as the remaining portion of its addressing input signal. The trellis encoder 9, the precoder 8 and the symbol mapper ROM 10 conform with the 8VSB trellis encoder, precoder and symbol mapper shown in FIG. 7 of A/53, Annex D. The precoder 8, the trellis encoder 9 and the symbol mapper ROM 10 are operated in conformance with A/53, Annex D, §§4.2.5 titled "Trellis coding". The precoder 8 has been used to accommodate simple comb filters being used in DTV receivers for suppression of NTSC interference. When NTSC broadcasting is officially ended, it is expected that the precoder 8 will be disabled and $Z_2$ bits will simply reproduce the $X_2$ bits.

The symbol mapper ROM 10 operates as a symbol mapper supplying 3-bit, 8-level symbols to a first-in/first-out buffer memory 11. The FIFO buffer memory 11 is operated to provide rate buffering and to open up intervals between 828-symbol groups in the symbol stream supplied to a symbol-code assembler 12, into which intervals the symbol-code assembler 12 inserts synchronizing signal symbols. Each of the successive data fields begins with a respective interval into which the symbol-code assembler 12 inserts symbol code descriptive of a data-segment-synchronization (DSS) sequence followed by symbol code descriptive of an initial data segment including an appropriate data-field-synchronization (DFS) sequence. Each data segment in the respective remainder of each data field is followed by a respective interval into which the symbol-code assembler 12 inserts symbol code descriptive of a respective DSS sequence. Apparatus 13 for inserting the offset to cause pilot is connected to receive assembled data fields from the symbol-code assembler 12. The apparatus 13 is simply a clocked digital adder that zero extends the number used as symbol code and adds a constant term thereto to generate a real-only modulating signal in digital form, supplied to a vestigial-sideband amplitude-modulation digital television transmitter 14 of conventional construction.

Figure 2:
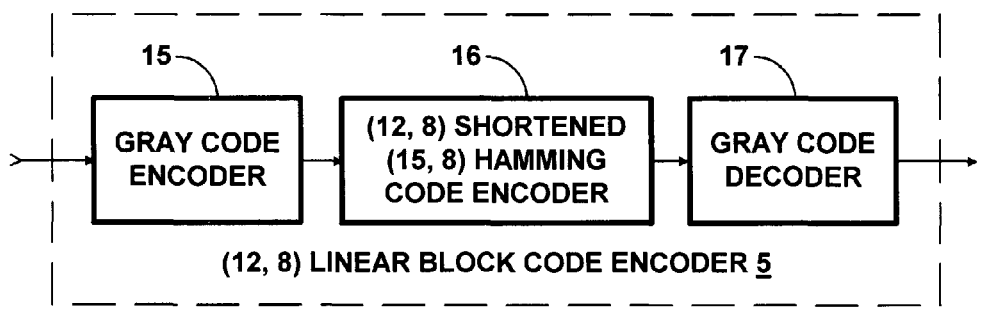
FIG. 2 is a detailed schematic diagram of a preferred construction of the (12, 8) linear block code encoder used in the FIG. 1 and FIG. 8 DTV transmitter apparatuses.
Figure 8:
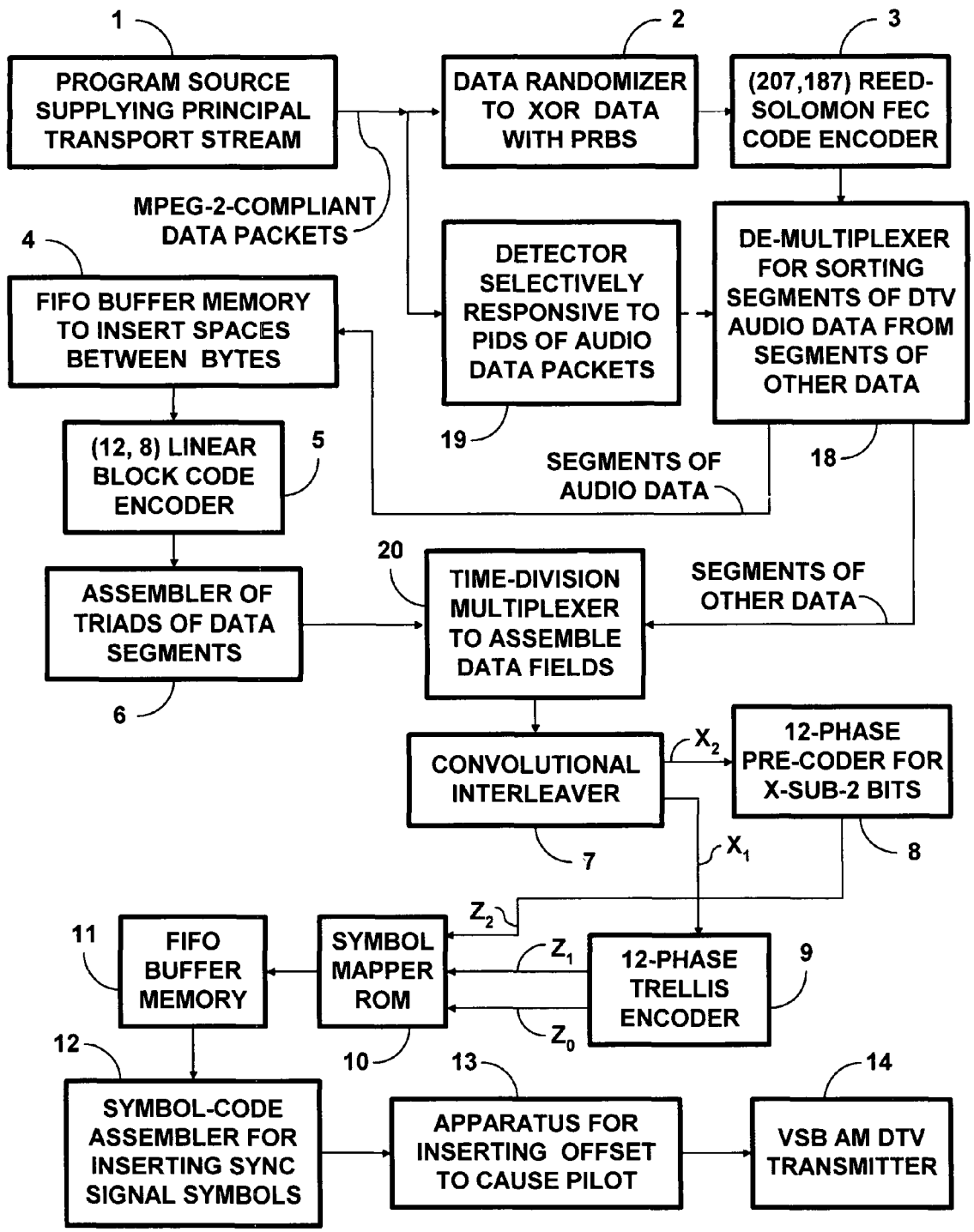
FIG. 8 is a schematic diagram of DTV transmitter apparatus embodying an aspect of the invention, which DTV transmitter apparatus provides additional coding of audio data packets that can be usefully received by legacy DTV receivers as well as being better received by DTV receivers designed to take advantage of the additional coding.

FIG. 2 shows in more detail a preferred construction of the (12, 8) linear block code encoder 5 used in the FIG. 1 and FIG. 8 DTV transmitter apparatuses. This preferred construction of the (12, 8) linear block code encoder 5 comprises a Gray code encoder 15, an encoder 16 for a shortened (15, 11) Hamming code, and a Gray code decoder 17. The input port of the Gray code encoder 15 is connected to receive bit pairs read from the FIFO memory 4 and to convert them to bit pairs of Gray code supplied from the encoder 15 output port. The output port of the Gray code encoder 15 is connected for supplying bytes of Gray code to the input port of the encoder 16 for (12, 8) linear block coding. The (12, 8) linear block coding supplied from the encoder 16 output port is shortened from (15, 11) Hamming coding. The output port of the encoder 16 for (12, 8) linear block coding is connected to the input port of the Gray code decoder 17. The output port of the Gray code decoder 17 is connected for supplying (12, 8) linear block coding to the triad assembler 6. By way of example, the Gray code encoder 15 and the Gray code encoder 17 can employ Gray coding of the type diagrammed in the FIG. 7 table. In actual practice, the (12, 8) linear block code encoder 5 will usually consist of a read-only memory that is equivalent to the FIG. 2 cascade connection of the Gray code encoder 15, the encoder 16 for a shortened (15, 11) Hamming code, and the Gray code decoder 17.

FIG. 3 is a table showing the known check equations for a (15, 11) Hamming code. The (15, 11) Hamming code uses parity checks over a portion of the first through fifteenth positions in a block of fifteen bits. The check bits are located in the first, second, fourth, and eighth positions. The third, fifth, sixth, seventh, ninth, tenth, eleventh, twelfth, thirteenth, fourteenth and fifteenth positions are reserved for data bits. Each check bit has a corresponding check equation that covers a portion of all the bits, but always includes the check bit itself. Consider the binary representation of the position numbers: 1=1$_2$, 2=10$_2$, 3=11$_2$, 4=100$_2$, 5=101$_2$, 6=110$_2$, and so forth. If the position number has a 1 as its rightmost bit, then the check equation for check bit 1 covers those positions. If the position number has a 1 as its next-to-rightmost bit, then the check equation for check bit 2 covers those positions. If the position number has a 1 as its third-from-rightmost bit, then the check equation for check bit 4 covers those positions.

If the position number has a 1 as its fourth-from-rightmost bit, then the check equation for check bit 8 covers those positions.

FIG. 4 is a table showing the check equations for a re-arranged (15, 11) Hamming code. In the re-arranged (15, 11) Hamming code the parity bits occupy the leading four positions, and the information bits occupy the trailing eleven positions. The re-arranged (15, 11) Hamming code can be shortened to a (12, 8) linear block code by making the information bits in three of the positions invariably 0.

FIG. 5 is a table showing the check equations for a first particular (12, 8) linear code shortened from the re-arranged (15, 11) Hamming code of the FIG. 4 table, which first particular (12, 8) linear code can be employed in the (12, 8) linear block code encoder 16 of FIG. 2. Choosing the information bits from the sixth, seventh and fourteenth original bit positions each to be invariably 0 shortens all four check equations by an odd number of terms. Check bit 1 in new position 1 becomes the modulo-2 sum of information bits in new positions 5, 6, 7, 9, 11 and 12. Check bit 2 in new position 2 becomes the modulo-2 sum of information bits in new positions 5, 8, 9 and 12. Check bit 4 in new position 3 becomes the modulo-2 sum of information bits in new positions 6, 10, 11 and 12. Check bit 8 in new position 4 becomes the modulo-2 sum of information bits in new positions 7, 8, 9, 10, 11 and 12.

FIG. 6 is a table showing the check equations for a second particular (12, 8) linear code shortened from the re-arranged (15, 11) Hamming code of the FIG. 4 table, which first particular (12, 8) linear code can be alternatively employed in the (12, 8) linear block code encoder 16 of FIG. 2. Choosing the information bits from the ninth, eleventh and thirteenth original bit positions each to be invariably 0 also shortens all four check equations by an odd number of terms. Check bit 1 in new position 1 becomes the modulo-2 sum of information bits in new positions 5, 6, 8 and 12. Check bit 2 in new position 2 becomes the modulo-2 sum of information bits in new positions 5, 7, 8, 9, 11 and 12. Check bit 4 in new position 3 becomes the modulo-2 sum of information bits in new positions 6, 7, 8, 10, 11 and 12. Check bit 8 in new position 4 becomes the modulo-2 sum of information bits in new positions 9, 10, 11 and 12.

Either of the first and second particular (12, 8) linear codes is suitable for use in the encoder 16 for a shortened (15, 11) Hamming code shown in FIG. 2. Complementing all the information bits in new positions 5, 6, 7, 8, 9, 10, 11, 12, 13 and 15 of either code will leave the check bits in new positions 1, 2, 3 and 4 unchanged. So, it follows, complementing all the bits of a codeword of the first or the second particular (12, 8) linear block code will result in an invalid (12, 8) LBC word. This provides a DTV receiver with a mechanism for detecting when all the bits of a (12, 8) LBC word were complemented at the DTV transmitter.

FIG. 8 shows DTV transmitter apparatus in which the segments of data descriptive of the audio portion of each DTV program are (12, 8) linear block coded for subsequent transmission at two-thirds the code rate of ordinary 8VSB signals. The FIG. 8 DTV transmitter apparatus differs from that of FIG. 1 in the following respects. The (207, 187) RS-FEC-code encoder 3 is connected for supplying (207, 187) RS-FEC-code words to the input port of a de-multiplexer 18 for sorting segments of DTV audio data from segments of other data. This sorting is controlled by control signal supplied to the de-multiplexer 18 from a detector 19 selectively responsive to the packet identification (PID) bits of an audio data packet appearing in the principal transport stream supplied from the program source 1. The output port of the de-multiplexer 18 to which just the segments of DTV audio data are sorted is connected for supplying those segments to the FIFO buffer memory 4 for subsequent (12, 8) linear block coding by the (12, 8) LBC encoder 5. The output port of the de-multiplexer 18 to which the segments of other data are sorted is connected for supplying those segments to a first input port of a time-division multiplexer 20 for assembling data fields to be applied to the convolutional interleaver 7. The output port of the triad assembler 6 is connected to a second input port of the time-division multiplexer 20, rather than directly to the input port of the convolutional interleaver 7. The output port of the time-division multiplexer 20 is connected for supplying the assembled data fields to the input port of the convolutional interleaver 7.

Figure 9:
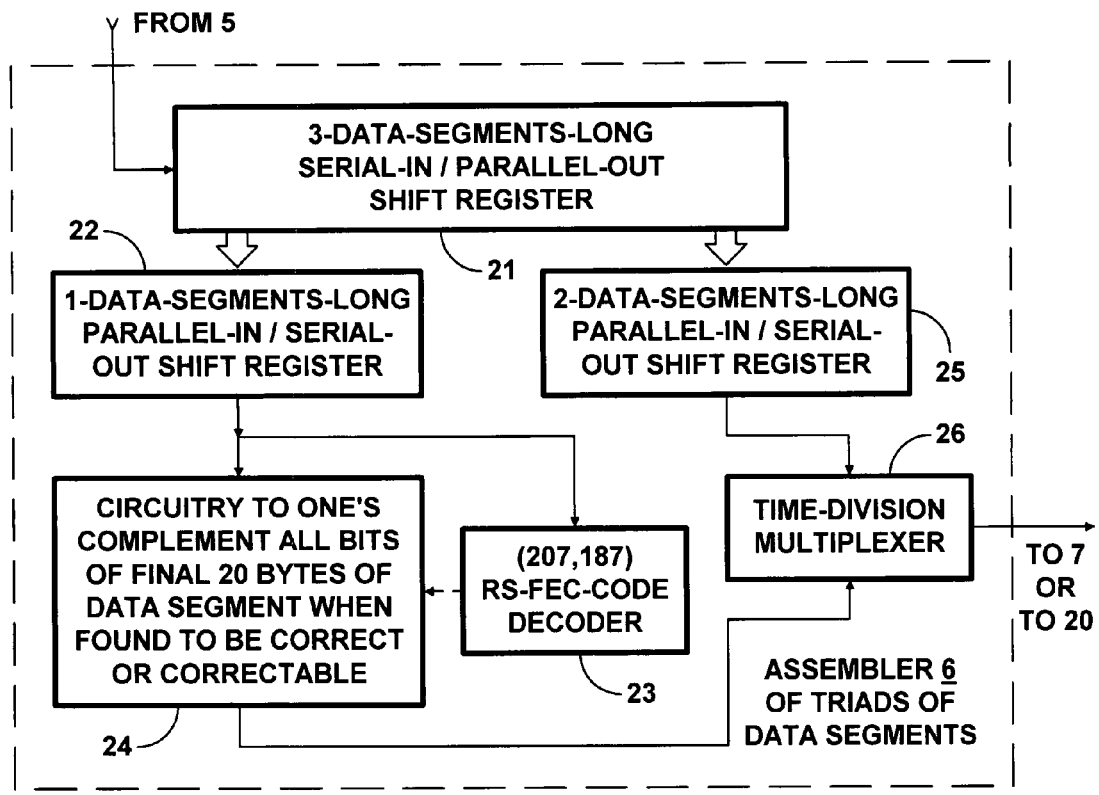
FIG. 9 is a schematic diagram showing in detail the portion of the FIG. 1 or FIG. 8 DTV transmitter apparatus which assembles triads of linear block coded data segments in accordance with an aspect of the invention.

FIG. 9 shows in some detail a suggested construction of the data-segment-triad assembler 6 used in the FIG. 1 and FIG. 8 DTV transmitter apparatuses. The assembler 6 includes a serial-in/parallel-out shift register 21 that is three data segments long. The serial input port of the SIPO shift register 21 is connected for receiving LBC-encoded (207, 187) RS-FEC-code words generated by the (12, 8) LBC encoder 5. Each time that two new LBC-encoded (207, 187) RS-FEC-code words have been shifted into the SIPO shift register 21, there is a parallel dump of the register 21 contents through its parallel-output port.

The parity bits from the LBC-encoded (207, 187) RS-FEC-code words are dumped from the register 21 to the parallel-input port of a parallel-in/serial-out shift register 22 that is one data segment long. These bits are shifted from the serial-output port of the PISO shift register 22 to generate the first data segment of a triad of data segments supplied from the assembler 6. The parallel dump connections to the parallel-input port of the PISO shift register 22 are such that the first data segment of each triad is composed in the following way. The parity bits for the LBC-coded data bytes of the second data segment of the triad appear first from the serial-output port of the PISO shift register 22 and then the parity bits for the LBC-coded data bytes of the third data segment of the triad appear next. The parity bits for the LBC-coded parity bytes of the second data segment of the triad appear thereafter, and finally the parity bits for the LBC-coded parity bytes of the third data segment of the triad appear.

The data segments shifted out through the serial-output port of the PISO shift register 22 are supplied as input signal to a (207, 187) RS-FEC-code decoder 23 of a type that can locate and correct up to ten erroneous bytes. Each of these data segments is also supplied as input signal to circuitry 24, which ordinarily reproduces all the bytes of the data segment in its response. When and only when the (207, 187) RS-FEC-code decoder 23 finds that one of these data segments to be a correct (207, 187) RS-FEC-code word or can correct it so to be, the decoder 24 supplies an indication of this to the circuitry 25. Responsive to this indication, the circuitry 23 selectively complements all the bits in the final twenty bytes of the data segment as would otherwise be reproduced in the circuitry 24 response.

The information bits from the LBC-encoded (207, 187) RS-FEC-code words are dumped from the register 18 to the parallel-input port of a parallel-in/serial-out shift register 25 that is two data segments long. These bits are shifted from the serial-output port of the PISO shift register 25 to generate the second and third data segments of a triad of data segments supplied from the assembler 6. These second and third data segments repeat data segments supplied from the (207, 187) RS-FEC-code encoder 4. They are of the form that can ultimately be usefully received by legacy DTV receivers.

A first input port of a time-division multiplexer 26 is connected for receiving the first data segments of successive triads from the selective bit-complementor circuitry 24. A second input port of the time-division multiplexer 26 is connected for receiving the second and third data segments of successive triads from the serial-output port of the PISO shift register 25. The time-division multiplexer 26 has an output port that serves as the output port of the assembler 6. In the FIG. 1 DTV transmitter apparatus this output port is connected directly to the input port of the convolutional interleaver 7. In the FIG. 8 DTV transmitter apparatus this output port is connected to the second input port of the time-division multiplexer 17, rather than directly to the input port of the convolutional interleaver 7. The individual time-division multiplexers 17 and 26 can be replaced by a three-input-port time-division multiplexer, if desired.

Figure 10:
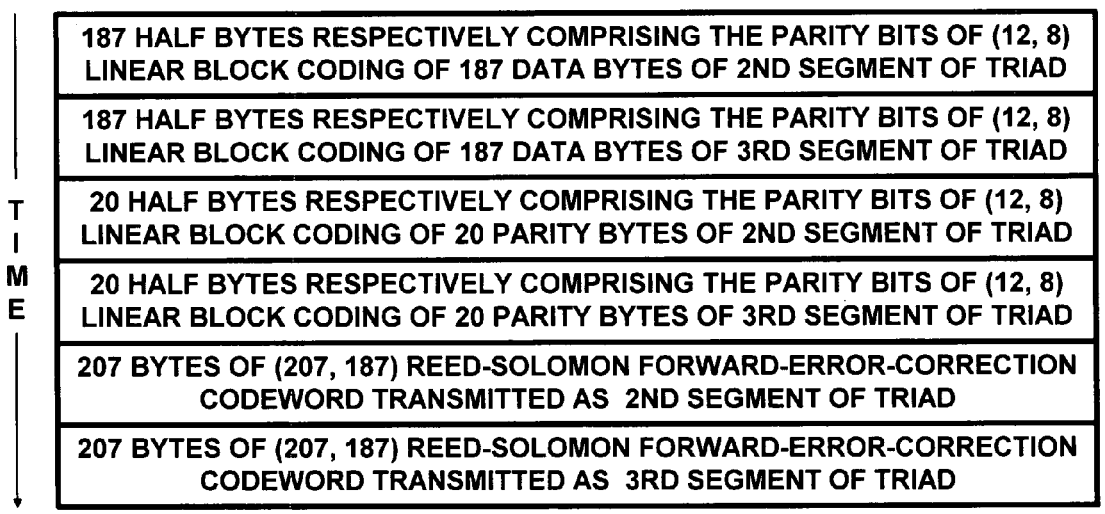
FIG. 10 is a diagram showing the composition of a triad of data segments transmitted by the DTV transmitter apparatuses of FIGS. 1 and 8, the initial one of which data segments in accordance with an aspect of the invention contains parity bits for (12, 8) linear block coding of the information in the second and third data segments.

FIG. 10 shows the composition of a triad of data segments transmitted by the DTV transmitter apparatuses of FIGS. 1 and 8. The initial data segment of the triad consists of the parity bits for (12, 8) linear block coding of the information in the second and third data segments. The first 187 half-bytes of this initial data segment are the parity bits of respective data bytes of a first LBC-coded (207, 187) RS-FEC-code word, the information bits of which codeword later appear as the second data segment of the triad. The next 187 half-bytes of the initial data segment of the triad are the parity bits of respective data bytes of a second LBC-coded (207, 187) RS-FEC-code word, the information bits of which codeword later appear as the third data segment of the triad. The next twenty half-bytes of the initial data segment of the triad are the parity bits of respective parity bytes of the first LBC-coded (207, 187) RS-FEC-code word. The final twenty half-bytes of the initial data segment of the triad are the parity bits of respective parity bytes of the second LBC-coded (207, 187) RS-FEC-code word.

The 207-byte initial data segment of the triad is followed by the 207-byte second data segment of the triad consisting of the information bits of the first LBC-coded (207, 187) RS-FEC-code word. The 207-byte second data segment of the triad is followed by the 207-byte third data segment of the triad consisting of the information bits of the second LBC-coded (207, 187) RS-FEC-code word. The (12, 8) linear block coding has a cyclic systematic format, so the second and third data segments of the triad are (207, 187) RS-FEC-code words that can be usefully received by a legacy DTV receiver.

Figure 11:
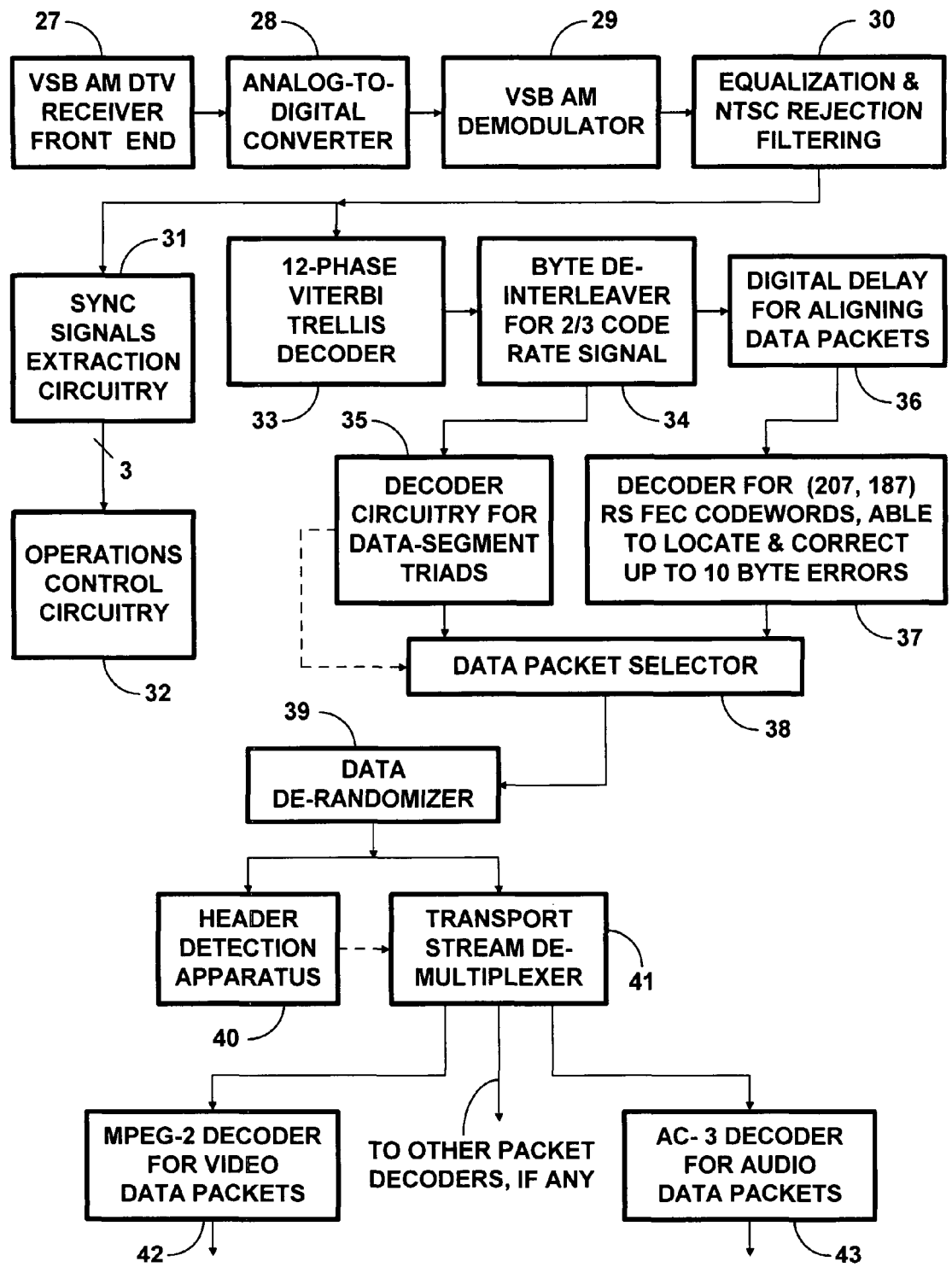
FIG. 11 is a schematic diagram of a DTV receiver embodying an aspect of the invention, which DTV receiver utilizes the additional coding of DTV signals provided by the FIG. 1 and FIG. 8 DTV transmitter apparatuses to achieve satisfactory reception even under adverse conditions.

The FIG. 11 DTV receiver apparatus includes a vestigial-sideband amplitude-modulation (VSB AM) DTV receiver front-end 27 for selecting a radio-frequency DTV signal for reception, converting the selected RF DTV signal to an intermediate-frequency DTV signal, and for amplifying the IF DTV signal. An analog-to-digital converter 28 is connected for digitizing the amplified IF DTV signal supplied from the DTV receiver front-end 27. A demodulator 29 is connected for demodulating the digitized VSB AM IF DTV signal to generate a digitized baseband DTV signal, which is supplied to digital filtering 30 for equalization of channel response and for rejection of co-channel interfering NTSC signal. Synchronization signals extraction circuitry 31 is connected for receiving the digital filtering 30 response. Responsive to data-field-synchronization (DFS) signals, the sync signals extraction circuitry 31 detects the beginnings of data frames and fields. Responsive to data-segment-synchronization (DSS) signals, the sync signals extraction circuitry 31 detects the beginnings of data segments. Operations control circuitry 32 is connected for receiving DFS signal, DSS signal and clocking signal at an even multiple of symbol rate via respective connections from the sync signals extraction circuitry 31.

A plural-mode 12-phase trellis decoder 33 of Viterbi type is connected for receiving the digital filtering 30 response and performing symbol-decoding procedures to recover bytes of data. The trellis decoder 33 is connected to supply eight-bit bytes of data to a byte de-interleaver 34 that complements the convolutional interleaver 7 in the DTV transmitter apparatuses of FIGS. 1 and 8. The byte de-interleaver 34 is connected for supplying de-interleaved segments of data to decoder circuitry 35 for data segment triads. One embodiment of this triad decoder circuitry 35 is shown in greater detail in FIGS. 12A, 12B and 12C. Other embodiments of this triad decoder circuitry 35 are shown in greater detail in FIGS. 20A, 20B and 20C and in FIGS. 21A, 21B and 21C. Any one of these embodiments of the decoder circuitry 35 includes (12,8) linear-block-code decoder circuitry besides (207, 187) RS-FEC-code decoder circuitry.

FIG. 11 shows the byte de-interleaver 34 connected for also supplying de-interleaved segments of data to digital delay circuitry 36. The digital delay circuitry 36 is connected for supplying delayed de-interleaved segments of data to a decoder 37 for (207, 187) Reed-Solomon forward-error-correcting codewords. The decoder 37 is of a conventional type capable of locating and correcting up to ten byte errors in a (207, 187) RS-FEC-code word and is used for decoding those words that are not part of a triad. The delay afforded by the digital delay circuitry 36 is such that the combined latent delay of the circuitry 36 and of the decoder 37 is equal to the latent delay of the triad decoder circuitry 35. A data packet selector 38 is connected for selecting data packets to a data de-randomizer 39 respective to a command signal generated by the triad decoder circuitry 35. If a correct(ed) MPEG-2-compliant data packet is available from the triad decoder circuitry 35, the data packet selector 38 is commanded to reproduce that signal for application to the data de-randomizer 39. Otherwise, the data packet selector 38 is commanded to reproduce the data packet supplied from the (207, 187) RS-FEC-code decoder 37, which packet is then applied to the data de-randomizer 39.

The de-randomizer 39 exclusive-ORs the data it receives from the data packet selector 38 with the PRBS specified in A/53, Annex D, §§4.2.2 to generate a de-randomized response supplied to header detection apparatus 40 and to a transport stream de-multiplexer 41 controlled by response from the header detection apparatus 40. The transport stream de-multiplexer 41 responds to the header detection apparatus 40 detecting selected PIDs in certain types of the de-randomized data packets from the data de-randomizer 39 for sorting those types of de-randomized data packets to appropriate packet decoders. For example, video data packets are sorted to an MPEG-2 decoder 42, and audio data packets are sorted to an AC-3 decoder 43. The data de-randomizer 39 will convert to a ONE the toggled TEI bit in a data packet indicating that it still contains byte errors. The MPEG-2 decoder 42 responds to the TEI bit in a packet of de-randomized data being ONE by not using the packet and by instituting measures to mask the effects of the packet not being used. AC-3 decoders known in the art respond to the TEI bit in packet of de-randomized data being ONE by not using the packet and by instituting measures to mask the effects of the packet not being used.

Figure 12A:
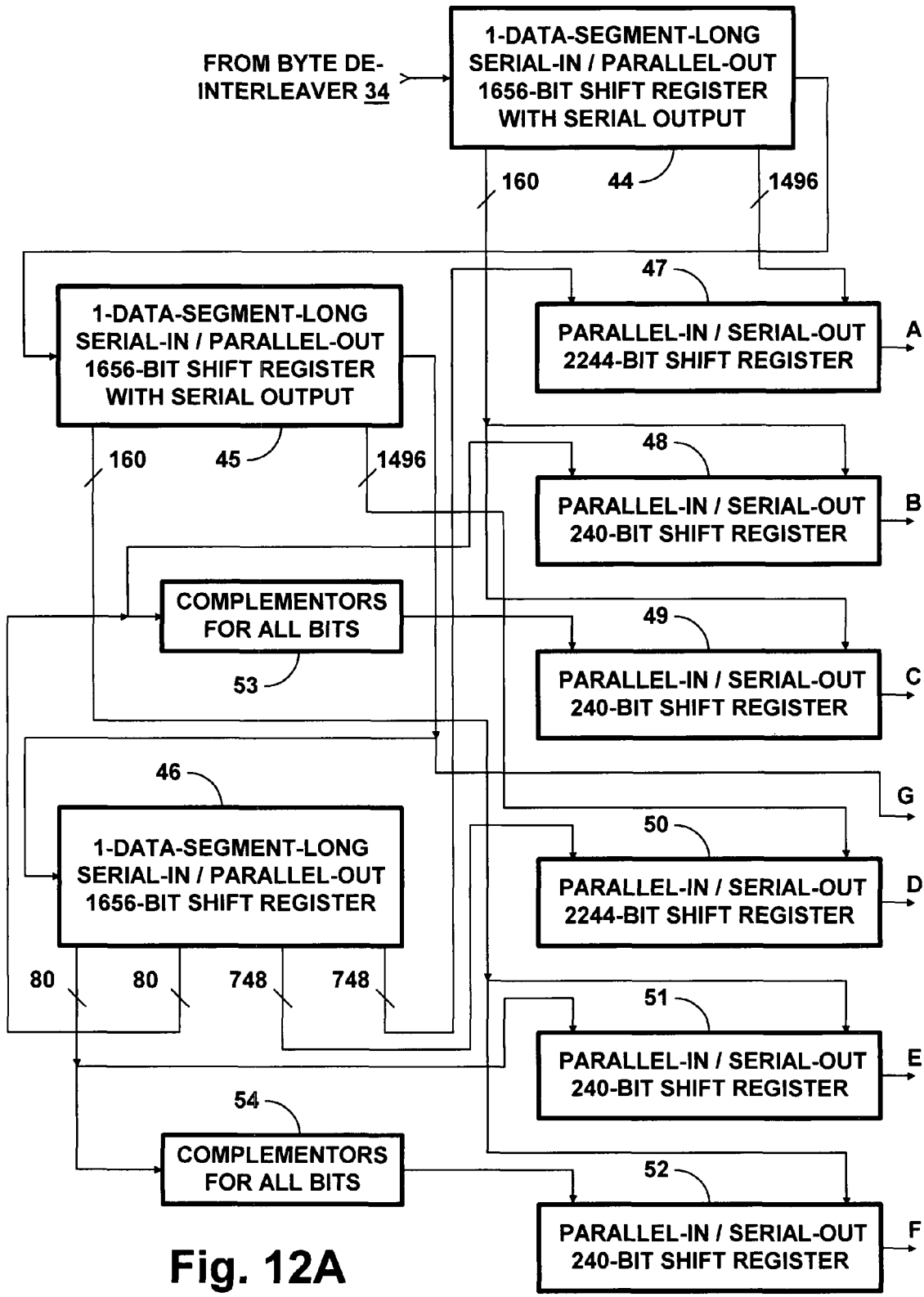
FIGS. 12A, 12B and 12C combine to form a FIG. 12 schematic diagram showing in detail one way to construct the portion of a DTV receiver used for decoding triads of data segments transmitted by the DTV transmitter apparatuses of FIGS. 1 and 8.

FIG. 12A shows an initial portion of a first embodiment of the triad decoder circuitry 32. The de-interleaved segments of data from the byte de-interleaver 34 are supplied to the serial-input port of a serial-in/parallel-out shift register 44 capable of temporarily storing a full data segment of 207 eight-bit bytes (i.e., 1656 bits). The shift register 44 also has a serial-output port connected to the serial-input port of a serial-in/parallel-out shift register 45 capable of temporarily storing a full data segment of 207 eight-bit bytes (i.e., 1656 bits). The shift register 45 also has a serial-output port connected to the serial-input port of a serial-in/parallel-out shift register 46 capable of temporarily storing a full data segment of 207 eight-bit bytes (i.e., 1656 bits). Together the SIPO shift registers 44, 45 and 46 can store successive ones of a complete triad of data segments, or can store contiguous portions of two successive triads of data segments while shifting goes on. Parallel transfers of data from the SIPO shift registers 44, 45 and 46 take place during each data segment synchronization interval after each of the SIPO shift registers 44, 45 and 46 has finished taking a respective data segment into temporary storage.

Parallel transfer from the SIPO shift register 44 includes reproducing the initial 187 bytes (i.e., 1496 bits) of the data segment temporarily stored therein for application to a portion of the parallel-input port of a parallel-in/serial-out shift register 47 capable of temporarily storing 187 twelve-bit (12, 8) linear-block-code words (i.e., 2244 bits). The connections from the shift register 44 to the shift register 47 position the transferred bits to be information bits within the twelve-bit (12, 8) linear-block-code words temporarily stored in the shift register 47. Parallel transfer from the SIPO shift register 44 further includes reproducing the final twenty bytes (i.e., 160 bits) of the data segment temporarily stored therein for application to portions of the respective parallel-input ports of parallel-in/serial-out shift registers 48 and 49. Each of the shift registers 48 and 49 is capable of temporarily storing twenty twelve-bit (12, 8) linear-block-code words (i.e., 240 bits).

Parallel transfer from the SIPO shift register 45 includes reproducing the initial 187 bytes (i.e., 1496 bits) of the data segment temporarily stored therein for application to a portion of the parallel-input port of a parallel-in/serial-out shift register 50 capable of temporarily storing 187 twelve-bit (12, 8) linear-block-code words (i.e., 2244 bits). The connections from the shift register 45 to the shift register 50 position the transferred bits to be information bits within the twelve-bit (12, 8) linear-block-code words temporarily stored in the shift register 50. Parallel transfer from the SIPO shift register 45 further includes reproducing the final twenty bytes (i.e., 160 bits) of the data segment temporarily stored therein for application to portions of the respective parallel-input ports of parallel-in/serial-out shift registers 51 and 52. Each of the shift registers 51 and 52 is capable of temporarily storing twenty twelve-bit (12, 8) linear-block-code words (i.e., 240 bits).

Parallel transfer from the SIPO shift register 46 includes reproducing the initial 93.5 bytes (i.e., 748 bits) of the data segment temporarily stored therein for application to a portion of the parallel-input port of the parallel-in/serial-out shift register 47. The connections from the shift register 46 to the shift register 47 position the transferred bits to be parity bits within the twelve-bit (12, 8) linear-block-code words temporarily stored in the shift register 47. Parallel transfer from the SIPO shift register 46 further includes reproducing the 93.5 bytes succeeding the initial 93.5 bytes of the data segment temporarily stored therein for application to a portion of the parallel-input port of the parallel-in/serial-out shift register 50. The connections from the shift register 46 to the shift register 50 position the transferred bits to be parity bits within the twelve-bit (12, 8) linear-block-code words temporarily stored in the shift register 50.

Parallel transfer from the SIPO shift register 46 still further includes reproducing the ten bytes succeeding the initial 187 bytes of the data segment temporarily stored therein for application to a parallel-input port of a bank 53 of complementors for all bits involved in this parallel transfer. These ten bytes from the SIPO shift register 46 are also applied to a portion of the parallel-input port of the parallel-in/serial-out shift register 48. The connections from the shift register 46 to the shift register 48 position the transferred bits to be parity bits within the twelve-bit (12, 8) linear-block-code words temporarily stored in the shift register 48. The complemented ten bytes from a parallel-output port of the bank 53 of complementors are applied to a portion of the parallel-input port of the parallel-in/serial-out shift register 49. The connections from the shift register 46 to the shift register 49 via the bank 53 of complementors position the transferred and complemented bits to be parity bits within the twelve-bit (12, 8) linear-block-code words temporarily stored in the shift register 49.

Finally, parallel transfer from the SIPO shift register 46 includes reproducing the final ten bytes temporarily stored therein for application to a parallel-input port of a bank 54 of complementors for all bits involved in this parallel transfer. The ten bytes from the SIPO shift register 46 are also applied to a portion of the parallel-input port of the parallel-in/serial-out shift register 51. The connections from the shift register 46 to the shift register 51 position the transferred bits to be parity bits within the twelve-bit (12, 8) linear-block-code words temporarily stored in the shift register 51. The complemented ten bytes from a parallel-output port of the bank 54 of complementors are applied to a portion of the parallel-input port of the parallel-in/serial-out shift register 52. The connections from the shift register 46 to the shift register 52 via the bank 54 of complementors position the transferred and complemented bits to be parity bits within the twelve-bit (12, 8) linear-block-code words temporarily stored in the shift register 52.

Figure 12B:
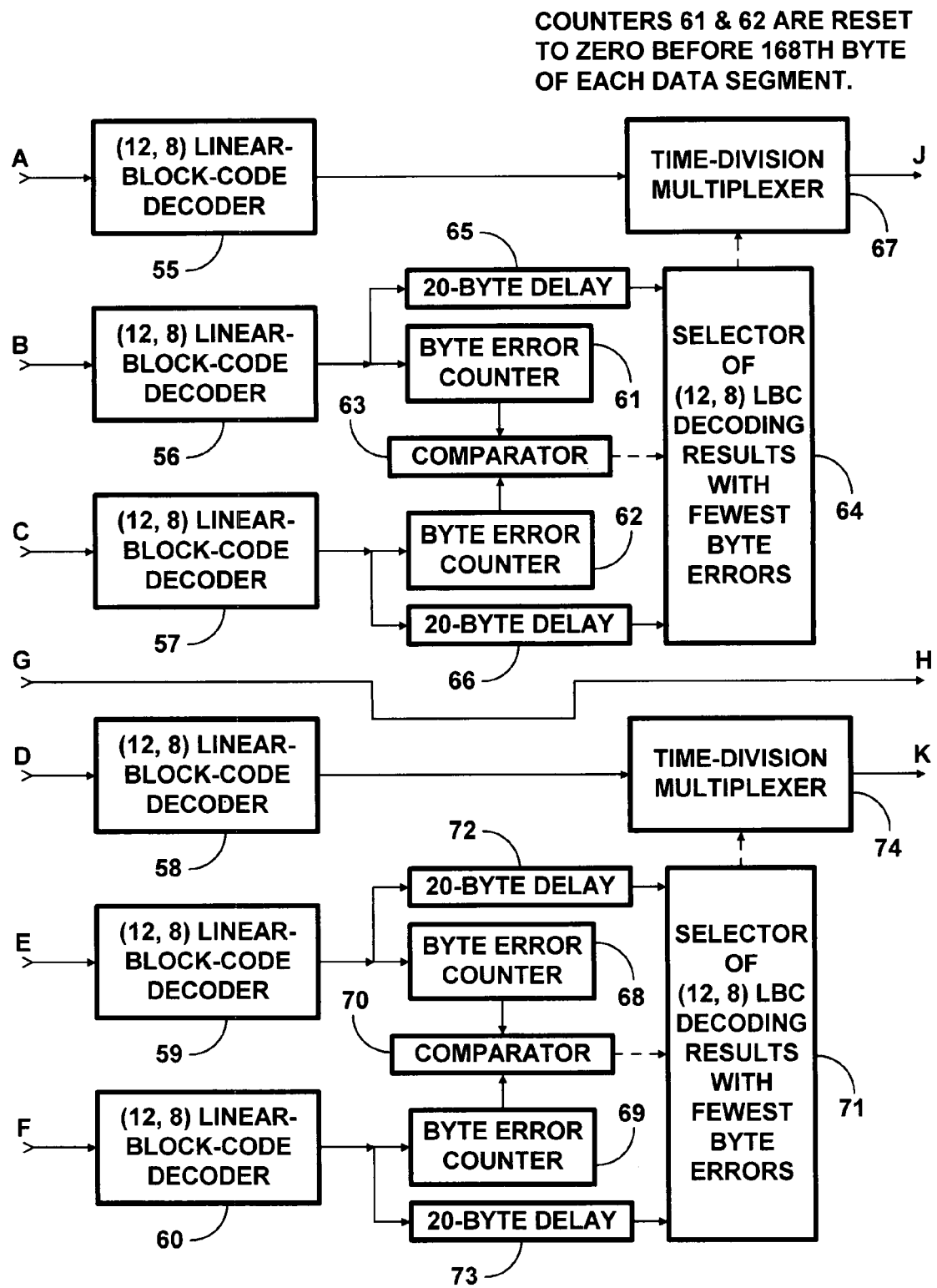
Figure 13:
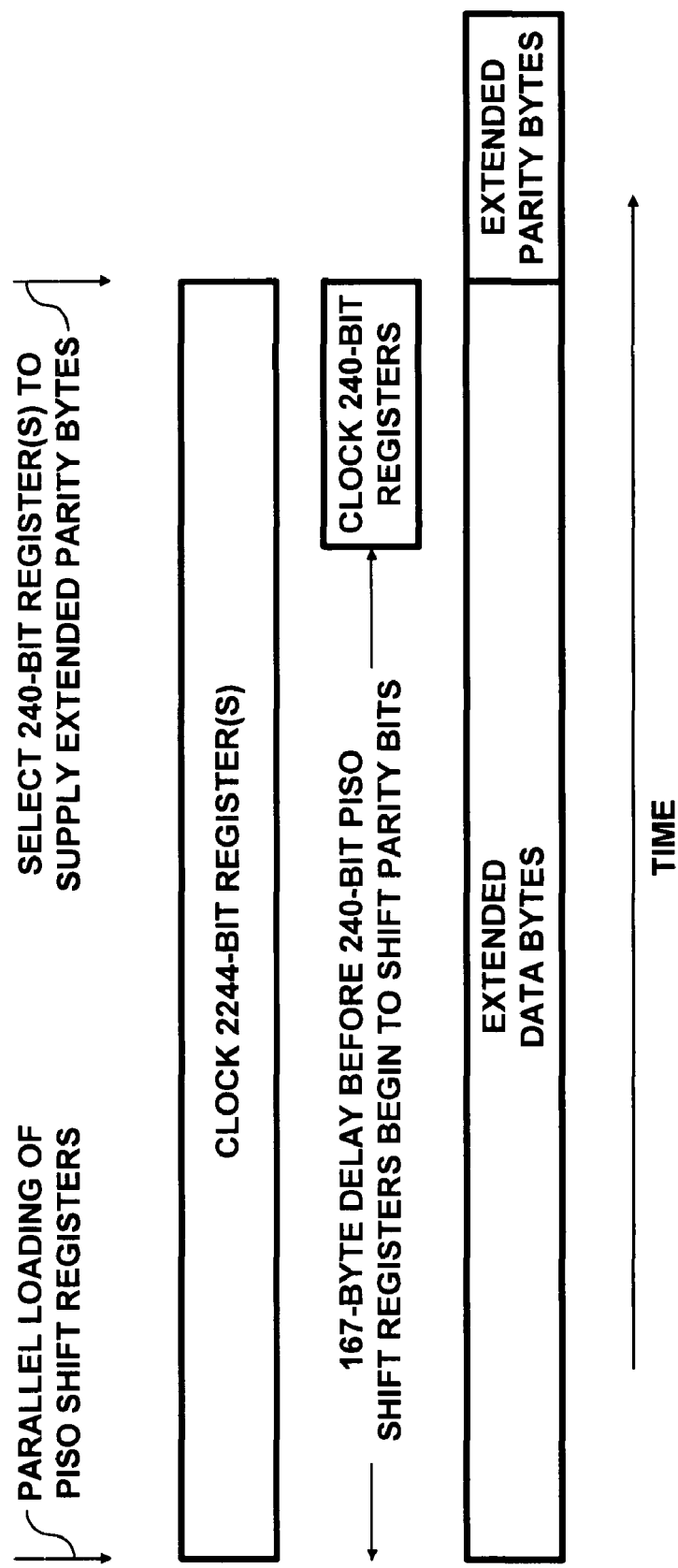
FIG. 13 is a timing diagram for circuitry shown in the FIG. 12 schematic diagram, circuitry shown in the FIG. 20 schematic diagram, and circuitry shown in the FIG. 21 schematic diagram.

The FIG. 13 timing diagram illustrates how the shift registers 47, 48 and 49 are clocked during a data segment interval following their respective parallel loading procedures during the segment-synchronization-signal (DSS) interval at the beginning of the data segment. Immediately after the parallel transfer of updated linear-block-coded data bytes to the PISO shift register 47, the PISO shift register 47 is clocked for shifting those bytes from its serial-output port through the interconnection A to the input port of a (12, 8) linear-block-code decoder 55 in FIG. 12B. The PISO shift registers 48 and 49 remain unclocked for 167 byte epochs after the parallel transfer of updated linear-block-coded RS-parity bytes to them during a DSS interval. Then, the register 49 is clocked for shifting updated linear-block-coded RS-parity bytes from its serial-output port to pass through the interconnection B to the input port of a (12, 8) linear-block-code decoder 56 in FIG. 12B. Concurrently, the register 49 is clocked for shifting its updated linear-block-coded RS-parity bytes from its serial-output port to pass through the interconnection C to the input port of a (12, 8) linear-block-code decoder 57 in FIG. 12B. After a delay of twenty byte epochs the response of one of the (12, 8) LBC decoders 56 and 57 is selected to succeed the response of the (12, 8) LBC decoder 55 to generate a data segment as shown at the bottom of FIG. 13. This data segment consists of 187 data bytes followed by twenty parity bytes, each byte being extended to nine-bits with extra byte indicating whether or not the byte was found to be in error.

The FIG. 13 timing diagram also illustrates how the shift registers 50, 51 and 52 are clocked during a data segment interval following their respective parallel loading procedures during the segment-synchronization-signal (DSS) interval at the beginning of the data segment. Immediately after the parallel transfer of updated linear-block-coded data bytes to the PISO shift register 50, the PISO shift register 50 is clocked for shifting those bytes from its serial-output port through the interconnection D to the input port of a (12, 8)

linear-block-code decoder 58 in FIG. 12B. The PISO shift registers 51 and 52 remain unclocked for 167, byte epochs after the parallel transfer of updated linear-block-coded RS-parity bytes to them during a DSS interval. Then, the register 51 is clocked for shifting updated linear-block-coded RS-parity bytes from its serial-output port to pass through the interconnection E to the input port of a (12, 8) linear-block-code decoder 59 in FIG. 12B. Concurrently, the register 52 is clocked for shifting updated linear-block-coded RS-parity bytes from its serial-output port to pass through the interconnection F to the input port of a (12, 8) linear-block-code decoder 60 in FIG. 12B. After a delay of twenty byte epochs the response of one of the (12, 8) LBC decoders 59 and 60 is selected to succeed the response of the (12, 8) LBC decoder 58 to generate a data segment as shown at the bottom of FIG. 13. This data segment consists of 187 data bytes followed by twenty parity bytes, each byte being extended to nine-bits with extra byte indicating whether or not the byte was found to be in error.

Each of the (12, 8) LBC decoders 55, 56, 57, 58, 59 and 60 in FIG. 12B is capable of correcting one erroneous information bit in a 12-bit codeword. Furthermore it can detect a two-bit error in a 12-bit codeword. Each of the (12, 8) LBC decoders 55, 56, 57, 58, 59 and 60 furnishes its respective output signal in 9-bit extended bytes. Each of these 9-bit extended bytes is composed of eight information bits extracted from a 12-bit codeword plus an extension bit indicating whether or not that LBC decoder found those eight information bits to contain error. The extension bits are used for locating byte errors in (207, 187) RS-FEC-code decoding procedures carried on in the DTV receiver circuitry shown in FIG. 12C. The extension bit in each 9-bit extended byte is a ZERO, if presumably there is no error in the eight information bits in the byte. The extension bit in each 9-bit extended byte is a ONE, if presumably there is error in one or more of the eight information bits in the byte.

On one hand, if all of the bits in the final twenty bytes of the data segment dumped from the SIPO shift register 46 were complemented at the DTV transmitter, the 12-bit words supplied to the (12, 8) LBC decoders 56 and 59 will not be correct(able) (12, 8) LBC codewords. However, the 12-bit words supplied to the (12, 8) LBC decoders 57 and 60 should be correct(able) (12, 8) LBC codewords. On the other hand, if none of the bits in the final twenty bytes of the data segment dumped from the SIPO shift register 46 were complemented at the DTV transmitter, the 12-bit words supplied to the (12, 8) LBC decoders 57 and 60 will not be correct(able) (12, 8) LBC codewords. However, the 12-bit words supplied to the (12, 8) LBC decoders 56 and 59 should be correct(able) (12, 8) LBC codewords.

A counter 61 is connected for counting the extension bits that are ONE in each 9-bit extended byte supplied from the (12, 8) LBC decoder 56 during the final twenty bytes of a data segment. A counter 62 is connected for counting the extension bits that are ONE in each 9-bit extended byte supplied from the (12, 8) LBC decoder 57 during the final twenty bytes of a data segment. A comparator 63 is connected for comparing the counts from the counters 61 and 62 to generate a control signal indicating whether the LBC decoder 56 output signal or the LBC decoder 57 output signal is more likely to reproduce the correct parity bytes for a (207, 187) RS-FEC-code word. This control signal controls selections made by a selector 64 for selecting the (12, 8) LBC decoding results with the fewest byte errors. The selector 64 is connected for selectively reproducing the LBC decoder 56 output signal as delayed twenty bytes by digital delay circuitry 65 or the LBC decoder 57 output signal as delayed twenty bytes by digital delay circuitry 66. The selector 64 is connected for supplying its selected response to a first input port of a time-division multiplexer 67. A second input port of the time-division multiplexer 67 is connected for receiving the LBC decoder 55 output signal. The time-division multiplexer 67 is operated for appending the twenty parity bytes of a (207, 187) RS-FEC-code word supplied to its first input port to the conclusion of the 187 data bytes of that (207, 187) RS-FEC-code word supplied to its second input port. The output port of the time-division multiplexer 67 is connected for supplying its output signal via an interconnection J to circuitry shown in FIG. 12C. This output signal comprises complete (207, 187) RS-FEC-code words with byte extensions indicating the locations of known byte errors.

A counter 68 is connected for counting the extension bits that are ONE in each 9-bit extended byte supplied from the (12, 8) LBC decoder 59 during the final twenty bytes of a data segment. A counter 69 is connected for counting the extension bits that are ONE in each 9-bit extended byte supplied from the (12, 8) LBC decoder 60 during the final twenty bytes of a data segment. A comparator 70 is connected for comparing the counts from the counters 68 and 69 to generate a control signal. This control signal indicates whether the LBC decoder 59 output signal or the LBC decoder 60 output signal is more likely to reproduce the correct parity bytes for a (207, 187) RS-FEC-code word. This control signal controls selections made by a selector 71 for selecting the (12, 8) LBC decoding results with the fewest byte errors. The selector 71 is connected for selectively reproducing the LBC decoder 59 output signal as delayed twenty bytes by digital delay circuitry 72 or the LBC decoder 60 output signal as delayed twenty bytes by digital delay circuitry 73. The selector 71 is connected for supplying its selected response to a first input port of a time-division multiplexer 74. A second input port of the time-division multiplexer 74 is connected for receiving the LBC decoder 58 output signal. The time-division multiplexer 74 is operated for appending the twenty parity bytes of a (207, 187) RS-FEC-code word supplied to its first input port to the conclusion of the 187 data bytes of that (207, 187) RS-FEC-code word supplied to its second input port. The output port of the time-division multiplexer 74 is connected for supplying its output signal via an interconnection H to circuitry shown in FIG. 12C. This output signal comprises complete (207, 187) RS-FEC-code words with byte extensions indicating the locations of known byte errors.

The digital delay circuitry 65, 66, 72 and 73 is used to provide the counters 61, 62, 68 and 69 time to complete their task of counting byte errors. The counters 61, 62, 68 and 69 can simply be accumulators for the ONEs that indicate byte errors. In constructions alternative to that shown in FIG. 12B, the combined byte errors from the LBC decoders 56 and 59 are counted, and the combined byte errors from the LBC decoders 57 and 60 are counted. Then, the counts are compared to generate control signal for both of the selectors 64 and 71.

Figure 12C:
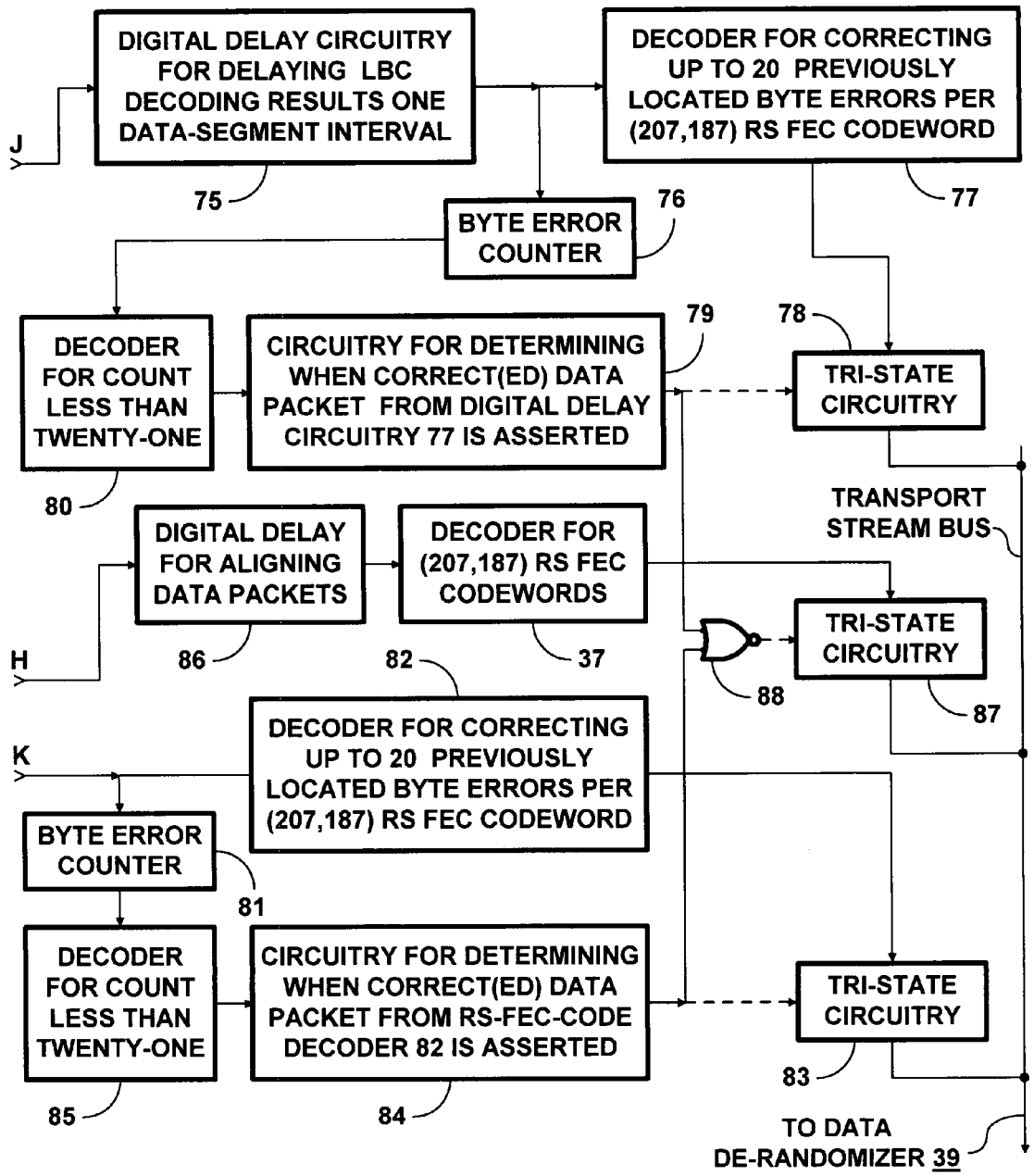

FIG. 12C shows digital delay circuitry 75 being connected for receiving via the interconnection J a delayed response to the (207, 187) RS-FEC-code words with byte extensions that the time-division multiplexer 67 shown in FIG. 12B supplies. The byte extensions are extracted from the delayed response of the digital delay circuitry 75 and supplied to the input port of a byte-error counter 76. An RS-FEC-code decoder 77 is connected to receive the bytes of the (207, 187) RS-FEC-code words together with the byte extensions. The byte extensions locate byte errors for the RS-FEC-code decoder 77, which uses the decoding algorithm that can correct up to twenty erroneous bytes the locations of which are already known.

The (207, 187) RS-FEC-code decoder 77 is connected for supplying data packets it has processed to the input port of tri-state circuitry 78. The output port of the tri-state circuitry 78 is connected to the TRANSPORT STREAM BUS, which connects to the input port of the data de-randomizer 39 shown in FIG. 11. Circuitry 79 generates a control signal for the tri-state circuitry 78 that determines when a data packet from the RS-FEC-code decoder 77 is to be reproduced at the tri-state circuitry 78 output port, from such low source impedance as to be asserted on the TRANSPORT STREAM BUS.

The single-bit byte extensions extracted from the response of the digital delay circuitry 75 are applied to the count input connection of the byte-error counter 76 and the ONEs are counted—e.g., by accumulation. The byte-error counter 76 is reset to zero count just before the beginning of each delayed (207, 187) RS-FEC-code word and can count up to at least 207. The counter 76 is connected to supply the count of byte errors to a range decoder 80 that generates a ONE if the count at the conclusion of a delayed (207, 187) RS-FEC-code word is less than twenty-one. A byte-error count in this range indicates that the (207, 187) RS-FEC-code word can be corrected during the current data-segment interval by the (207, 187) RS-FEC-code decoder 77.

The circuitry 79 includes sample-and-hold circuitry for sampling the range decoder 80 response at the conclusion of a delayed (207, 187) RS-FEC-code word, which response is indicative of whether or not there were fewer than twenty-one erroneous bytes in that codeword. The circuitry 79 further includes digital delay circuitry that delays the sampled-and-held range decoder 80 response so as to compensate for the latent delay in the (207, 187) RS-FEC-code decoder 77.

FIG. 12C shows the input port of a byte-error counter 81 and the input port of a decoder 82 for (207, 187) Reed-Solomon forward-error-correction codewords being connected from the interconnection K that transmits the (207, 187) RS-FEC-code words with byte extensions supplied by the time-division multiplexer 75 shown in FIG. 12B. The byte-error counter 81 receives the byte extensions for counting byte errors via its connection from interconnection K. The RS-FEC-code decoder 82 receives the bytes of the (207, 187) RS-FEC-code words together with the byte extensions. The byte extensions locate byte errors for the RS-FEC-code decoder 82, which uses the decoding algorithm that can correct up to twenty erroneous bytes the locations of which are already known. The (207, 187) RS-FEC-code decoder 82 is connected for supplying data packets it has processed to the input port of tri-state circuitry 83. The output port of the tri-state circuitry 83 is connected to the TRANSPORT STREAM BUS, which connects to the input port of the data de-randomizer 39 shown in FIG. 11. Circuitry 84 generates a control signal for the tri-state circuitry 83 that determines when a data packet from the RS-FEC-code decoder 82 is to be reproduced at the tri-state circuitry 83 output port, from such low source impedance as to be asserted on the TRANSPORT STREAM BUS.

The single-bit byte extensions supplied by the time-division multiplexer 75 are applied to the count input connection of the byte-error counter 81 and the ONEs are counted—e.g., by accumulation. The byte-error counter 81 is reset to zero count just before the beginning of each (207, 187) RS-FEC-code word and can count up to at least 207. The counter 81 is connected to supply the count of byte errors to a range decoder 85 that generates a ONE if the count at the conclusion of a (207, 187) RS-FEC-code word is less than twenty-one. A byte-error count in this range indicates that the (207, 187) RS-FEC-code word can be corrected during the current data-segment interval by the (207, 187) RS-FEC-code decoder 82.

The circuitry 84 includes sample-and-hold circuitry for sampling the range decoder 85 response at the conclusion of a delayed (207, 187) RS-FEC-code word, which response is indicative of whether or not there were fewer than twenty-one erroneous bytes in that codeword. The circuitry 84 further includes digital delay circuitry for delaying the sampled-and-held range decoder 85 response so as to compensate for the latent delay in the (207, 187) RS-FEC-code decoder 82.

The SIPO shift registers 44, 45 and 46 in FIG. 12A correspond to a portion of the digital delay circuitry 36 preceding the (207, 187) RS-FEC-code decoder 37 in FIG. 11. A serial output port of the SIPO shift register 45 connects via interconnections G and H to the input port of further digital delay circuitry 86 in FIG. 12C. This further digital delay circuitry 88 is the remaining portion of the digital delay circuitry 36 used to align data packets from the (207, 187) RS-FEC-code decoder 37 with those from the (207, 187) RS-FEC-code decoders 77 and 82. The digital delay circuitry 86 compensates for delays in the FIG. 12B circuitry. The output port of the further digital delay circuitry 86 supplies data segments to the (207, 187) RS-FEC-code decoder 37.

The (207, 187) RS-FEC-code decoder 37 is connected for supplying data packets it has processed to the input port of tri-state circuitry 87. The output port of the tri-state circuitry 87 is connected to the TRANSPORT STREAM BUS, which connects to the input port of the data de-randomizer 39 shown in FIG. 11. The tri-state circuitry 87 is connected to receive the output response of a two-input NOR gate 88 as a control signal. This control signal is a ONE when and only when a data packet from the RS-FEC-code decoder 37 is to be reproduced at the tri-state circuitry 87 output port, from such low source impedance as to be asserted on the TRANSPORT STREAM BUS. The data packet selector 38 of FIG. 11 corresponds essentially to the tri-state circuitry 78, the tri-state circuitry 83 and the tri-state circuitry 87 connected together to the TRANSPORT STREAM BUS in FIG. 12C.

The NOR gate 88 receives the circuitry 79 response as a first input signal thereto and receives the circuitry 84 response as a second input signal thereto. If the circuitry 79 response is a ONE conditioning the tri-state circuitry 78 to assert its output signal on the TRANSPORT STREAM BUS, the NOR gate 88 responds with a ZERO. If the circuitry 84 response is a ONE conditioning the tri-state circuitry 83 to assert its output signal on the TRANSPORT STREAM BUS, the NOR gate 88 responds with a ZERO. A ZERO response from the NOR gate 88 conditions the tri-state circuitry 89 to exhibit high source impedance to the TRANSPORT STREAM BUS, so as not to compete for access to that bus.

If the data segments transferred in parallel from the SIPO shift registers 44 and 45 were not the third and second segments in a triad, the data segment transferred in parallel from the SIPO shift register 46 was not the first segment in a triad. If the data segment transferred in parallel from the SIPO shift register 46 was not the first segment in a triad, the bits of that data segment will not for the most part provide parity bits that cause the (12, 8) LBC decoders 55, 56, 57, 58, 59 and 60 to find error-free bytes. The byte-error counts from the counters 76 and 81 will each be almost certainly much higher than twenty. Responsive to the range decoder 80 response being ZERO owing to the high count from the byte-error counter 76, the circuitry 79 will supply a ZERO response that conditions the tri-state circuitry 78 to exhibit high source impedance to the TRANSPORT STREAM BUS. Responsive to the range decoder 85 response being ZERO owing to the high count from the byte-error counter 81, the circuitry 84 will supply a ZERO response that conditions the tri-state circuitry 83 to exhibit high source impedance to the TRANSPORT STREAM BUS. The circuitry 79 response being a ZERO and the circuitry 84 response being a ZERO causes the response of the NOR gate 88 to be a ONE. This ONE applied as control signal to the tri-state circuitry 87 conditions it to reproduce the data packet from the RS-FEC-code decoder 37 from such low source impedance as to be asserted on the TRANSPORT STREAM BUS. The data packet is so asserted whether or not the transport-error-indicator (TEI) bit therein is a ONE indicating the data packet to contain remaining byte error(s). The RS-FEC-code decoder 37 furnishes the TRANSPORT STREAM BUS with the data packets from all (207, 187) RS-FEC-code words that are not included in a triad, such as those used for transmitting ordinary 8VSB signals.

Figure 14:
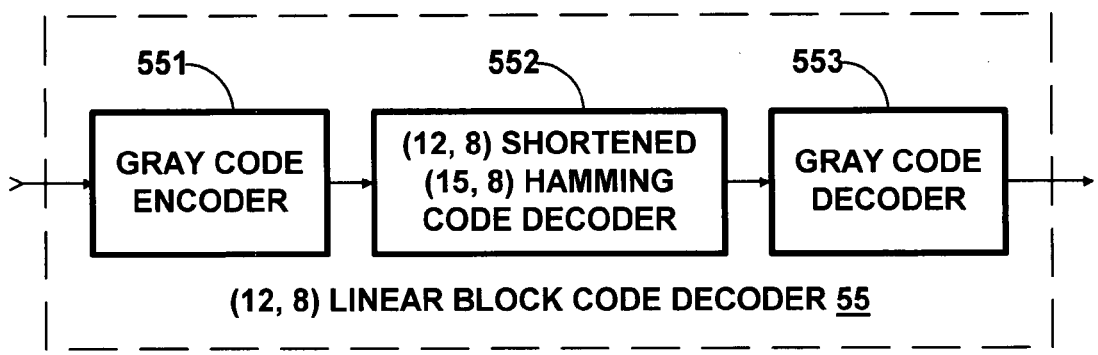
FIGS. 14, 15, 16, 17, 18 and 19 are schematic diagrams showing preferred constructions of the (12, 8) linear block code decoders used in the FIG. 12B portion of a DTV receiver.
Figure 15:
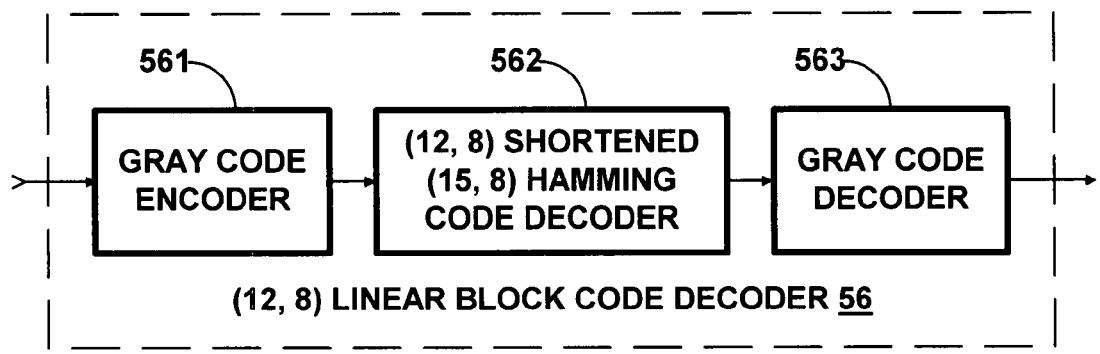
Figure 16:
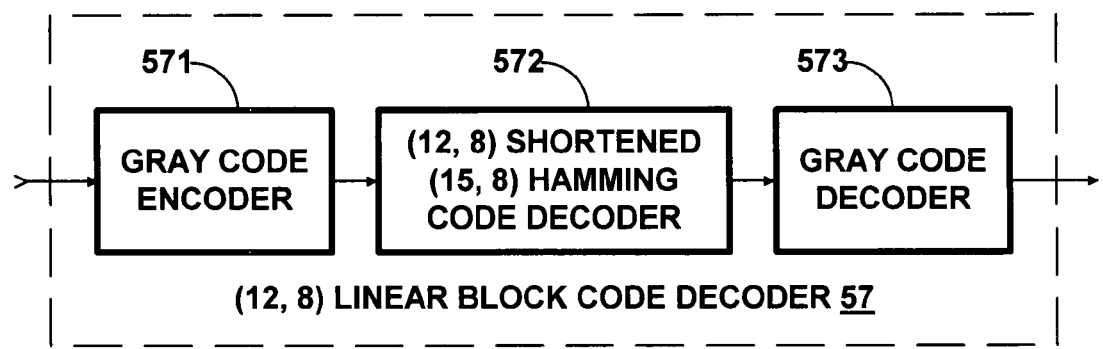
Figure 17:
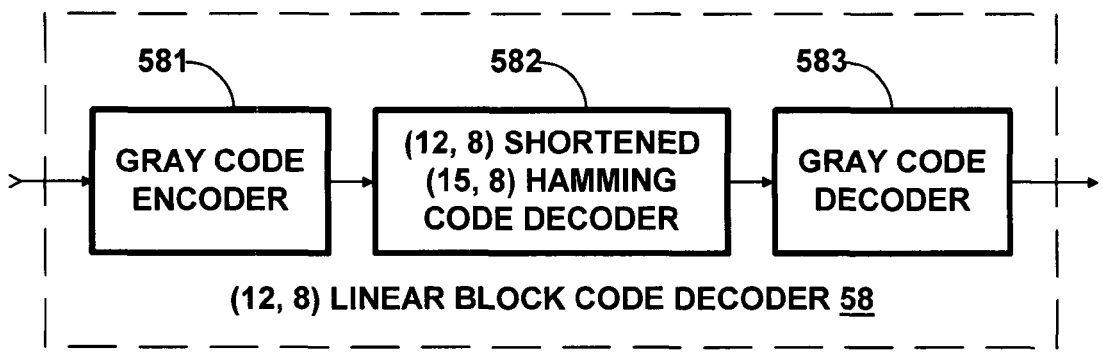
Figure 18:
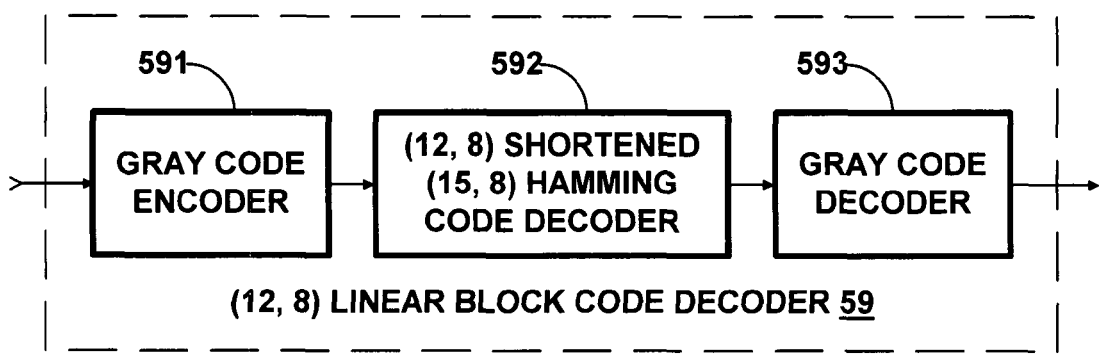
Figure 19:
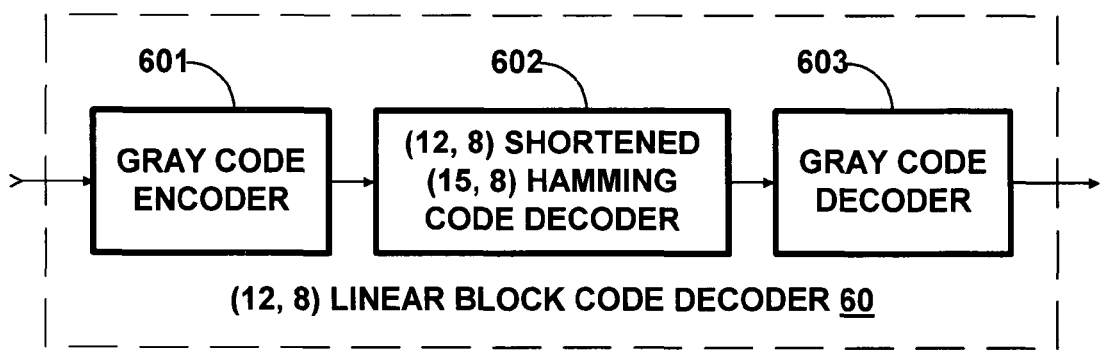

FIG. 14 shows in some detail one way to construct the (12, 8) linear block code decoder 55 in FIG. 12B presuming that the (12, 8) LBC encoder 5 used in the DTV transmitter is of the type shown in FIG. 2. In FIG. 14 the decoder 55 comprises a Gray code encoder 551, a decoder 552 for (12, 8) shortened (15, 8) Hamming code and a Gray code decoder 553, all in cascade connection. FIG. 15 shows in some detail one way to construct the (12, 8) linear block code decoder 56 in FIG. 12B presuming that the (12, 8) LBC encoder 5 used in the DTV transmitter is of the type shown in FIG. 2. In FIG. 14 the decoder 56 comprises a Gray code encoder 561, a decoder 562 for (12, 8) shortened (15, 8) Hamming code and a Gray code decoder 563, all in cascade connection. FIG. 16 shows in some detail one way to construct the (12, 8) linear block code decoder 57 in FIG. 12B presuming that the (12, 8) LBC encoder 5 used in the DTV transmitter is of the type shown in FIG. 2. In FIG. 16 the decoder 57 comprises a Gray code encoder 571, a decoder 572 for (12, 8) shortened (15, 8) Hamming code and a Gray code decoder 573, all in cascade connection. FIG. 17 shows in some detail one way to construct the (12, 8) linear block code decoder 58 in FIG. 12B presuming that the (12, 8) LBC encoder 5 used in the DTV transmitter is of the type shown in FIG. 2. In FIG. 17 the decoder 58 comprises a Gray code encoder 581, a decoder 582 for (12, 8) shortened (15, 8) Hamming code and a Gray code decoder 583, all in cascade connection. FIG. 18 shows in some detail one way to construct the (12, 8) linear block code decoder 59 in FIG. 12B presuming that the (12, 8) LBC encoder 5 used in the DTV transmitter is of the type shown in FIG. 2. In FIG. 18 the decoder 59 comprises a Gray code encoder 591, a decoder 592 for (12, 8) shortened (15, 8) Hamming code and a Gray code decoder 593, all in cascade connection. FIG. 19 shows in some detail one way to construct the (12, 8) linear block code decoder 60 in FIG. 12B presuming that the (12, 8) LBC encoder 5 used in the DTV transmitter is of the type shown in FIG. 2. In FIG. 19 the decoder 60 comprises a Gray code encoder 601, a decoder 602 for (12, 8) shortened (15, 8) Hamming code and a Gray code decoder 603, all in cascade connection. The extension bits indicating whether or not bytes are in error are supplied by the decoders 552, 562, 572, 582, 592 and 602 for (12, 8) shortened (15, 8) Hamming code, bypassing the Gray code decoders 553, 563, 573, 583, 593 and 603. This is so although FIGS. 14, 15, 16, 17, 18 and 19 do not show these details. In practice, it is likely that each of the (12, 8) LBC decoders 55, 56, 57, 58, 59 and 60 will be constructed as a respective read-only memory.

Figure 20A:
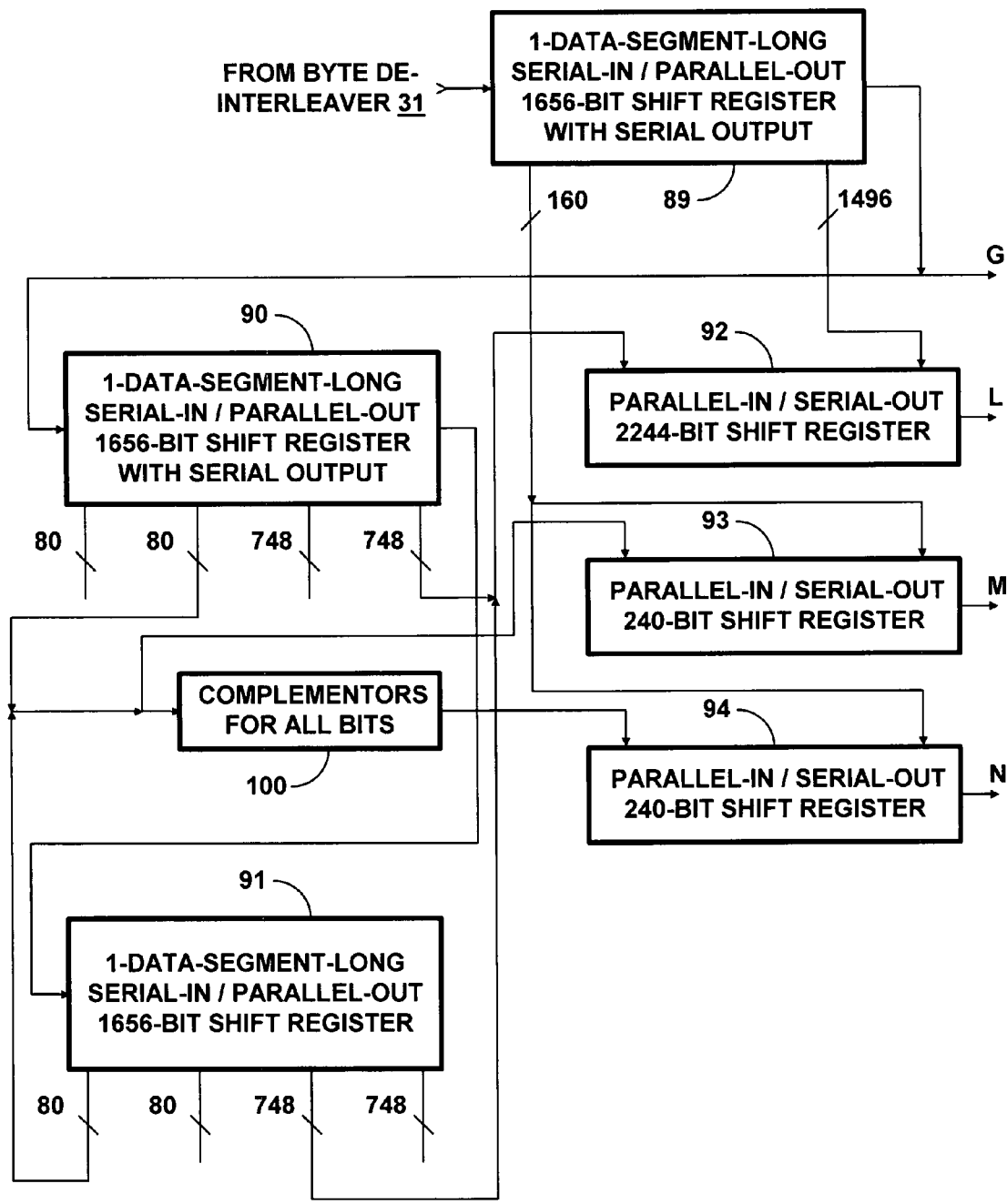
FIGS. 20A, 20B and 20C combine to form a FIG. 20 schematic diagram showing in detail another way to construct the portion of a DTV receiver used for decoding triads of data segments transmitted by the DTV transmitter apparatuses of FIGS. 1 and 8.

FIG. 20A shows an initial portion of a second embodiment of the triad decoder circuitry 32, which employs half as many LBC decoders as the first embodiment described above. Also, one fewer (207, 187) RS-FEC-code decoder is employed. The de-interleaved segments of data from the byte de-interleaver 31 are supplied to the serial-input port of a serial-in/parallel-out shift register 89 capable of temporarily storing a full data segment of 207 eight-bit bytes (i.e., 1656 bits). The shift register 89 also has a serial-output port connected to the serial-input port of a serial-in/parallel-out shift register 90 capable of temporarily storing a full data segment of 207 eight-bit bytes (i.e., 1656 bits). The shift register 90 also has a serial-output port connected to the serial-input port of a serial-in/parallel-out shift register 91 capable of temporarily storing a full data segment of 207 eight-bit bytes (i.e., 1656 bits). Together, the SIPO shift registers 89, 90 and 91 can store successive ones of a complete triad of data segments, or can store contiguous portions of two successive triads of data segments while shifting goes on. Parallel transfers of data from the SIPO shift registers 89, 90 and 91 take place during each data segment synchronization interval after each of the SIPO shift registers 89, 90 and 91 has finished taking a respective data segment into temporary storage.

Parallel transfer from the SIPO shift register 89 includes reproducing the initial 187 bytes (i.e., 1496 bits) of the data segment temporarily stored therein for application to a parallel-input port of a parallel-in/serial-out shift register 92 capable of temporarily storing 187 twelve-bit (12, 8) linear-block-code words (i.e., 2244 bits). The connections from the shift register 89 to the shift register 92 position the transferred bits to be information bits within the twelve-bit (12, 8) linear-block-code words temporarily stored in the shift register 92. Parallel transfer from the SIPO shift register 89 further includes reproducing the final twenty bytes (i.e., 160 bits) of the data segment temporarily stored therein for application to respective parallel-input ports of parallel-in/serial-out shift registers 93 and 94. Each of the shift registers 93 and 94 is capable of temporarily storing twenty twelve-bit (12, 8) linear-block-code words (i.e., 240 bits).

Parallel transfer from the SIPO shift register 90 occurs for every data segment that is not the third data segment of a triad. Parallel transfer from the SIPO shift register 90 includes reproducing the initial 93.5 bytes (i.e., 748 bits) of the data segment temporarily stored therein for application to a parallel-input port of the parallel-in/serial-out shift register 92. The connections from the shift register 90 to the shift register 92 position the transferred bits to be parity bits within the twelve-bit (12, 8) linear-block-code words temporarily stored in the shift register 92. Parallel transfer from the SIPO shift register 90 further includes reproducing the ten bytes succeeding the initial 187 bytes of the data segment temporarily stored therein for application to a parallel-input port of a bank 95 of complementors for all bits involved in this parallel transfer. These ten bytes from the SIPO shift register 90 are also applied to a parallel-input port of the parallel-in/serial-out shift register 93. The connections from the shift register 90 to the shift register 93 position the transferred bits to be parity bits within the twelve-bit (12, 8) linear-block-code words temporarily stored in the shift register 93. The complemented ten bytes from a parallel-output port of the bank 95 of complementors are applied to a parallel-input port of the parallel-in/serial-out shift register 94. The connections from the shift register 90 to the shift register 94 via the bank 95 of complementors position the transferred and complemented bits to be parity bits within the twelve-bit (12, 8) linear-block-code words temporarily stored in the shift register 94.

Parallel transfer from the SIPO shift register 91 occurs for every data segment that is the third data segment of a triad. Parallel transfer from the SIPO shift register 91 includes reproducing the 93.5 bytes succeeding the initial 93.5 bytes of the data segment temporarily stored therein for application to a parallel-input port of the parallel-in/serial-out shift register 92. The connections from the shift register 87 to the shift register 92 position the transferred bits to be parity bits within the twelve-bit (12, 8) linear-block-code words temporarily stored in the shift register 92. Parallel transfer from the SIPO shift register 91 further includes reproducing the final ten bytes temporarily stored therein for application to the bank 95 of complementors for all bits involved in this parallel transfer. These ten bytes from the SIPO shift register 91 are also applied to a parallel-input port of the parallel-in/serial-out shift register 93. The connections from the shift register 91 to the shift register 93 position the transferred bits to be parity bits within the twelve-bit (12, 8) linear-block-code words temporarily stored in the shift register 93. The complemented ten bytes from a parallel-output port of the bank 95 of complementors are applied to a parallel-input port of the parallel-in/serial-out shift register 94. The connections from the shift register 91 to the shift register 94 via the bank 95 of complementors position the transferred and complemented bits to be parity bits within the twelve-bit (12, 8) linear-block-code words temporarily stored in the shift register 94.

Figure 20B:
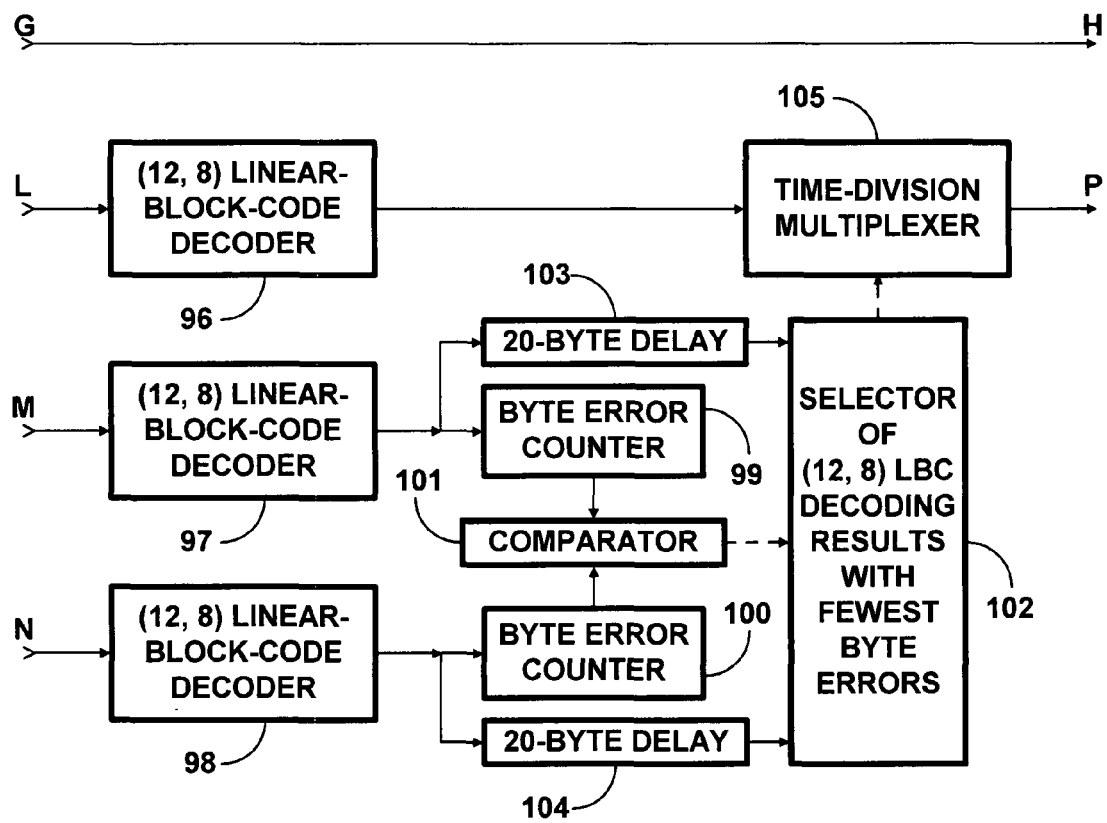

After the parallel transfer to the PISO shift register 92 in FIG. 20A during a data-segment-synchronization interval, the register 92 shifts the updated data segment out of its serial-output port to pass through the interconnection L to the input port of a (12, 8) linear-block-code decoder 96 in FIG. 20B. After the parallel transfer to the PISO shift register 93 in FIG. 20A during a data-segment-synchronization interval, the register 93 shifts the updated data segment out of its serial-output port to pass through the interconnection M to the input port of a (12, 8) linear-block-code decoder 97 in FIG. 20B. After the parallel transfer to the PISO shift register 94 in FIG. 20A during a data-segment-synchronization interval, the register 94 shifts the updated data segment out of its serial-output port to pass through the interconnection M to the input port of a (12, 8) linear-block-code decoder 98 in FIG. 20B.

Each of the (12, 8) LBC decoders 96, 97 and 98 in FIG. 20B is capable of correcting one erroneous information bit in a 12-bit codeword. Furthermore, it can detect a two-bit error in a 12-bit codeword. Each of the (12, 8) LBC decoders 96, 97 and 98 furnishes its respective output signal in 9-bit extended bytes. Each of these 9-bit extended bytes is composed of eight information bits extracted from a 12-bit codeword plus an extension bit indicating whether or not that LBC decoder found those eight information bits to contain error. The extension bits will be used for locating byte errors in (207, 187) RS-FEC-code decoding procedures carried on in the DTV receiver circuitry shown in FIG. 20C. The extension bit in each 9-bit extended byte is a ZERO, if presumably there is no error in the eight information bits in the byte. The extension bit in each 9-bit extended byte is a ONE, if presumably there is error in one or more of the eight information bits in the byte.

A counter 99 is connected for counting the extension bits that are ONE in each 9-bit extended byte supplied from the (12, 8) LBC decoder 97 during the final twenty bytes of a data segment. A counter 100 is connected for counting the extension bits that are ONE in each 9-bit extended byte supplied from the (12, 8) LBC decoder 98 during the final twenty bytes of a data segment. A comparator 101 is connected for comparing the counts from the counters 99 and 100. This comparison generates a control signal indicating whether the LBC decoder 97 output signal or the LBC decoder 98 output signal is more likely to reproduce the correct parity bytes for a (207, 187) RS-FEC-code word. This control signal controls selections made by a selector 102 for selecting the (12, 8) LBC decoding results with the fewest byte errors. The selector 102 is connected for selectively reproducing the LBC decoder 97 output signal as delayed twenty bytes by digital delay circuitry 103 or the LBC decoder 98 output signal as delayed twenty bytes by digital delay circuitry 104. The selector 102 is connected for supplying its selected response to a first input port of a time-division multiplexer 105. A second input port of the time-division multiplexer 105 is connected for receiving the LBC decoder 96 output signal. The time-division multiplexer 105 is operated for appending the twenty parity bytes of each (207, 187) RS-FEC-code word supplied to its first input port to the conclusion of the 187 data bytes of that (207, 187) RS FEC codeword supplied to its second input port. The output port of the time-division multiplexer 105 is connected for supplying its output signal via an interconnection P to circuitry shown in FIG. 20C. This output signal comprises complete (207, 187) RS-FEC-code words with byte extensions indicating the locations of known byte errors.

The digital delay circuitry 103 and 104 is used to provide the counters 99 and 100 time to complete their task of counting byte errors. The counters 99 and 100 can simply be accumulators for the ONEs that indicate byte errors.

Figure 20C:
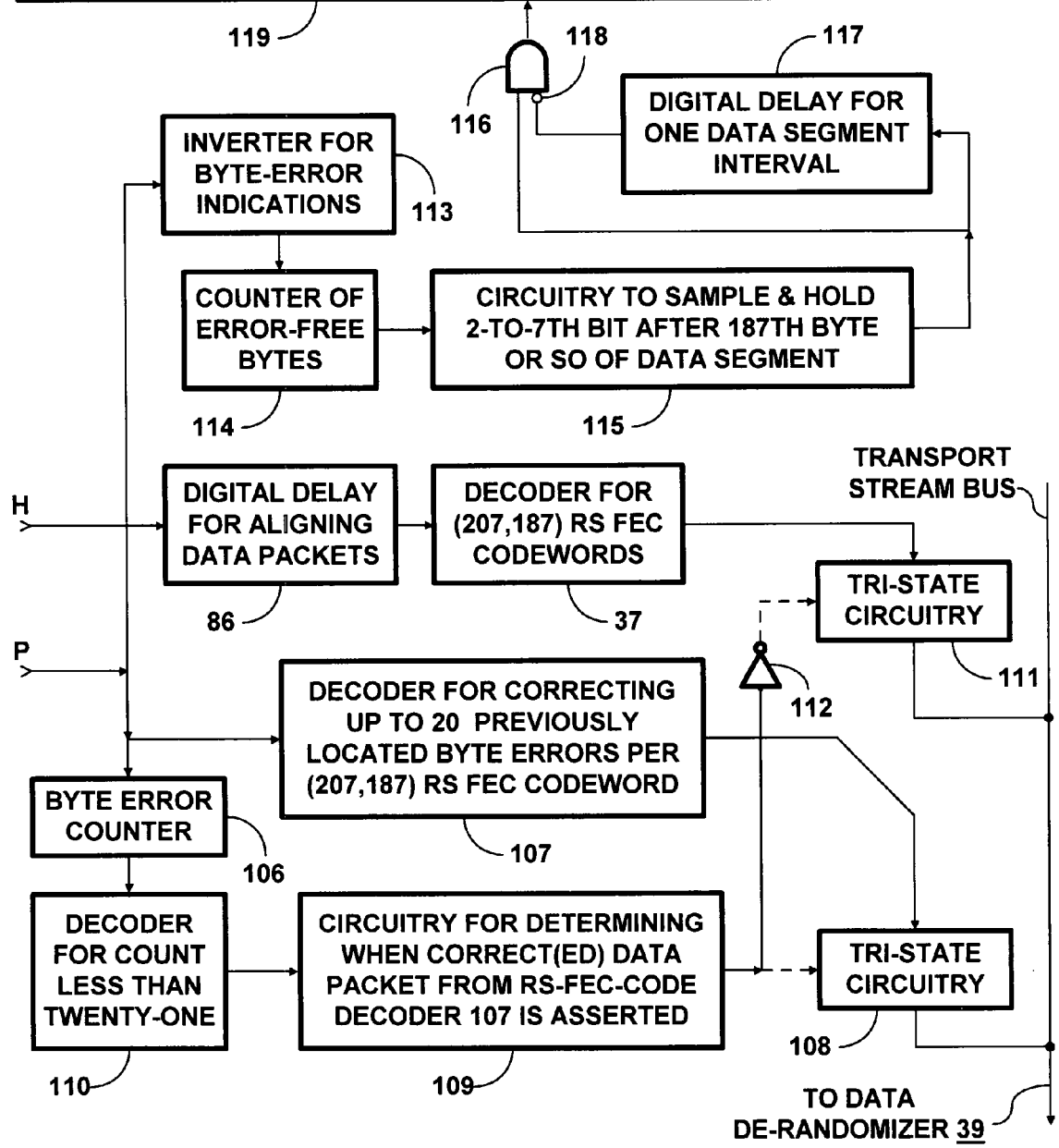

FIG. 20C shows the input port of a byte-error counter 106 and the input port of a decoder 107 for (207, 187) Reed-Solomon forward-error-correction codewords being connected from the interconnection P. The decoder 107 is connected to receive the (207, 187) RS-FEC-code words with byte extensions supplied by the time-division multiplexer 105 shown in FIG. 20B. The byte extensions locate byte errors for the RS-FEC-code decoder 107, which uses the decoding algorithm that can correct up to twenty erroneous bytes the locations of which are already known. The (207, 187) RS-FEC-code decoder 107 is connected for supplying data packets it has processed to the input port of tri-state circuitry 108. The output port of the tri-state circuitry 108 is connected to the TRANSPORT STREAM BUS, which connects to the input port of the data de-randomizer 39 shown in FIG. 11. Circuitry 109 generates a control signal for the tri-state circuitry 108 that determines when a data packet from the RS-FEC-code decoder 107 is to be reproduced at the tri-state circuitry 108 output port, from such low source impedance as to be asserted on the TRANSPORT STREAM BUS.

The single-bit byte extensions supplied by the time-division multiplexer 105 are applied to the count input connection of the byte-error counter 106 and the ONEs are counted—e.g., by accumulation. The byte-error counter 106 is reset to zero count just before the beginning of each (207, 187) RS FEC codeword and can count up to at least 207. The counter 106 is connected to supply the count of byte errors to a range decoder 110 that generates a ONE if the count at the conclusion of a (207, 187) RS FEC codeword is less than twenty-one. A byte-error count in this range indicates that the (207, 187) RS FEC codeword can be corrected during the current data-segment interval by the (207, 187) RS-FEC-code decoder 107.

The SIPO shift registers 89, 90 and 91 in FIG. 20A correspond to a portion of the digital delay circuitry 36 preceding the (207, 187) RS-FEC-code decoder 37 in FIG. 11. A serial output port of the SIPO shift register 89 connects via interconnections G and H to the input port of further digital delay circuitry 88 in FIG. 20C. This further digital delay circuitry 88 is the remaining portion of the digital delay circuitry 36 used to align data packets from the (207, 187) RS-FEC-code decoder 37 with those from the (207, 187) RS-FEC-code decoder 107. The digital delay circuitry 88 compensates for delays in the FIG. 20B circuitry. The output port of the further digital delay circuitry 88 supplies data segments to the (207, 187) RS-FEC-code decoder 37.

The (207, 187) RS-FEC-code decoder 37 is connected for supplying data packets it has processed to the input port of tri-state circuitry 89. The output port of the tri-state circuitry 89 is connected to the TRANSPORT STREAM BUS, which connects to the input port of the data de-randomizer 39 shown in FIG. 11. The (207, 187) RS-FEC-code decoder 37 is connected for supplying data packets it has processed to the input port of tri-state circuitry 111. The output port of the tri-state circuitry 111 is connected to the TRANSPORT STREAM BUS, which connects to the input port of the data de-randomizer 39 shown in FIG. 11. The tri-state circuitry 111 is connected to receive the output response of a logic inverter 112 as a control signal. This control signal is a ONE when and only when a data packet from the RS-FEC-code decoder 37 is to be reproduced at the tri-state circuitry 111 output port, from such low source impedance as to be asserted on the TRANSPORT STREAM BUS. The input port of the logic inverter 112 is connected for being supplied the same control signal that the circuitry 109 supplies to the tri-state circuitry 108. The logic inverter 112 supplies a ZERO control signal to the tri-state circuitry 111 in response to a ONE control signal supplied from the circuitry 109. The ZERO response from the logic inverter 112 conditions the tri-state circuitry 111 to exhibit high source impedance to the TRANSPORT STREAM BUS.

The circuitry 109 includes sample-and-hold circuitry for sampling the decoder 110 response at the conclusion of a delayed (207, 187) RS FEC codeword, which response is a ONE when there were fewer than twenty-one erroneous bytes in that codeword and is otherwise a ZERO. The circuitry 109 further includes digital delay circuitry that delays the sampled-and-held decoder 110 response so as to compensate for the latent delay in the (207, 187) RS-FEC-code decoder 107.

If there were twenty-one or more erroneous bytes in the codeword supplied to the decoder 110, the circuitry 109 generates a ZERO control signal for the tri-state circuitry 108 that conditions it to exhibit high source impedance to the TRANSPORT STREAM BUS. The logic inverter 112 supplies a ONE control signal to the tri-state circuitry 111 in response to the ZERO control signal supplied from the circuitry 109. The ONE response from the logic inverter 112 conditions the tri-state circuitry 111 to assert a data packet on the TRANSPORT STREAM BUS connecting to the input port of the data de-randomizer 39 shown in FIG. 11.

A remaining consideration is how to arrange for parallel transfer from the SIPO register 91 during each DSS interval after a data segment that is the third data segment of a triad has been shifted into the SIPO register 89. This, rather than parallel transfer from the SIPO register 90 during each DSS interval after a data segment that is not the third data segment of a triad has been shifted into the SIPO register 89. FIG. 20C shows the input port of a logic inverter 113 connected for receiving byte extensions supplied to the interconnection P from the time-division multiplexer 105 shown in FIG. 20B. The output port of the logic inverter 113 is connected to the count input of a counter 114 that over each data segment interval accumulates the ONEs which indicate correct bytes in that interval. The counter 114 is reset to zero count just before the beginning of each (207, 187) RS FEC codeword and can count up to at least 207. Sample-and-hold circuitry 115 samples the 27 bit of the count output from the counter 114 enough time before the reset to zero count to allow for the redundancy in the FIG. 20B circuitry. This bit will be a ONE if the LBC decoders found at least at least 128 of the bytes in the preceding portion of the data segment not to contain detectable byte error, but will be a ZERO if fewer such bytes were found. Unless the previous data segment was the second or the third data segment of a triad, the odds are overwhelmingly against the sampled-and-held bit being a ONE. A two-input AND gate 116 is connected for receiving as a first input signal thereof the response of the sample-and-hold circuitry 115. The AND gate 116 is connected for receiving as a second input signal thereof the previous response of the sample-and-hold circuitry 115 as delayed by one data-segment interval by digital delay circuitry 117 and then inverted by logic inverter 118. The AND gate 116 response will be a ONE for the data-segment interval following the second data segment of a triad and will otherwise be a ZERO. The AND gate 116 response is supplied as a control signal to the parallel-transfer control circuitry 119 for the SIPO shift registers 89, 90 and 91. One skilled in the art of digital electronics design will perceive that variants of the FIG. 20C circuitry are possible which use a single counter, rather than the two counters 106 and 114.

Figure 21A:
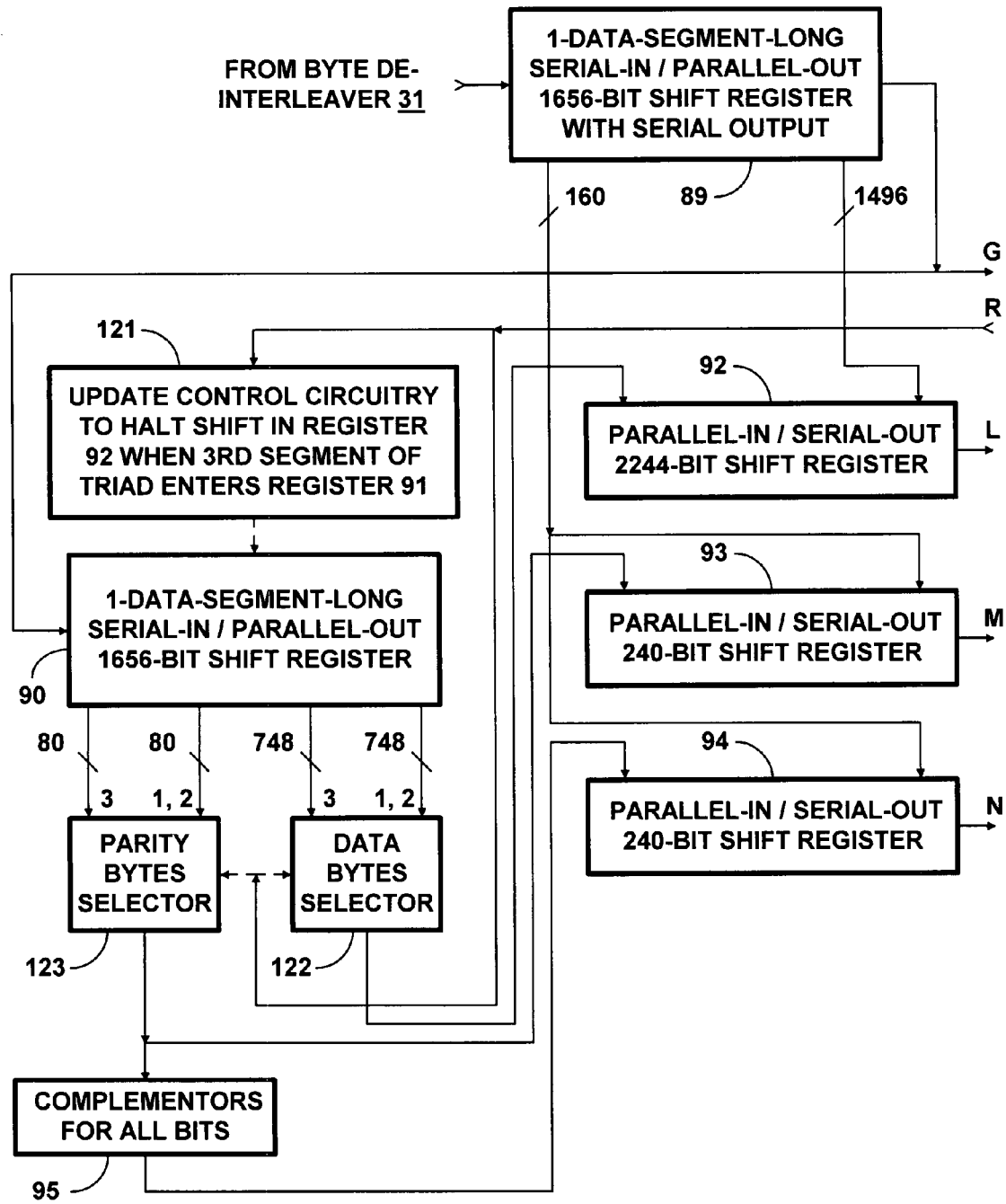
FIGS. 21A, 21B and 21C combine to form a FIG. 21 schematic diagram showing in detail still another way to construct the portion of a DTV receiver used for decoding triads of data segments transmitted by the DTV transmitter apparatuses of FIGS. 1 and 8.
Figure 21B:
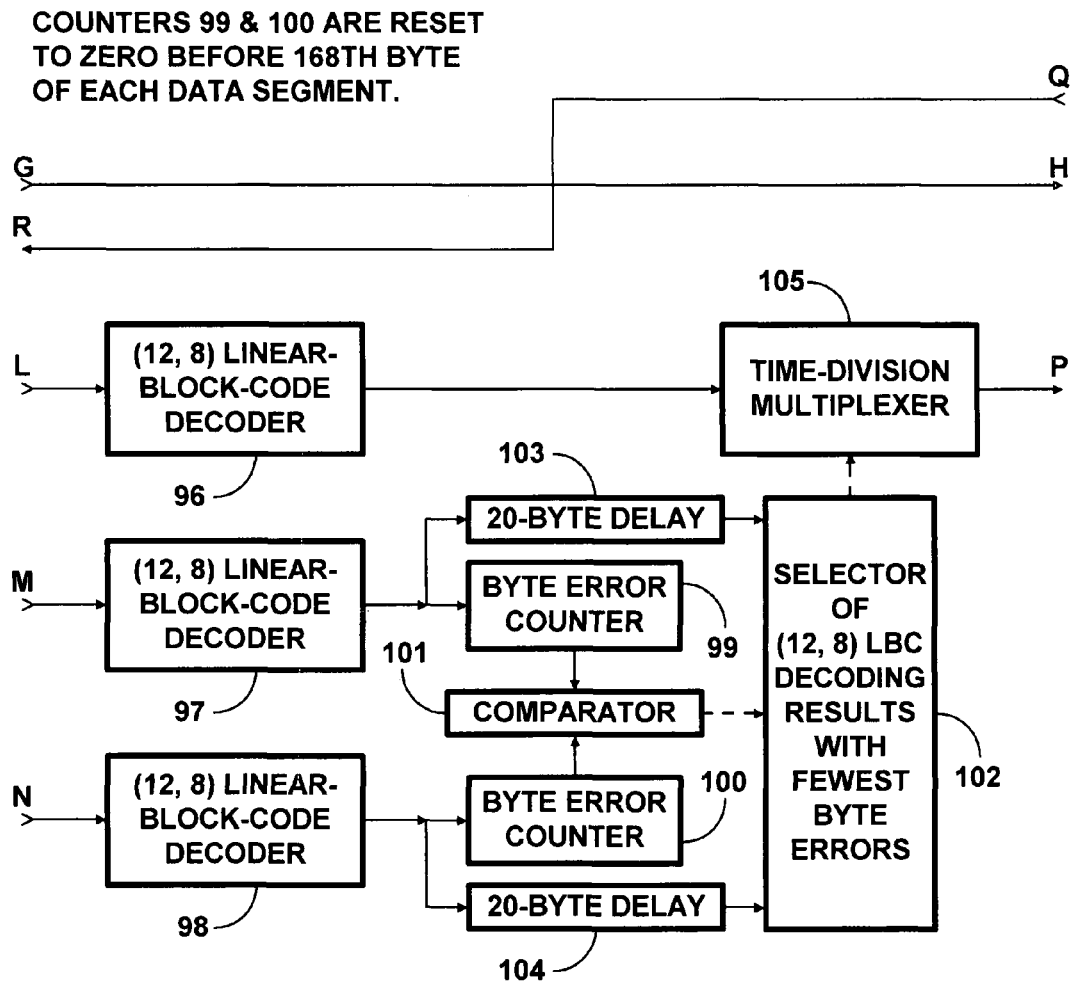
Figure 21C:
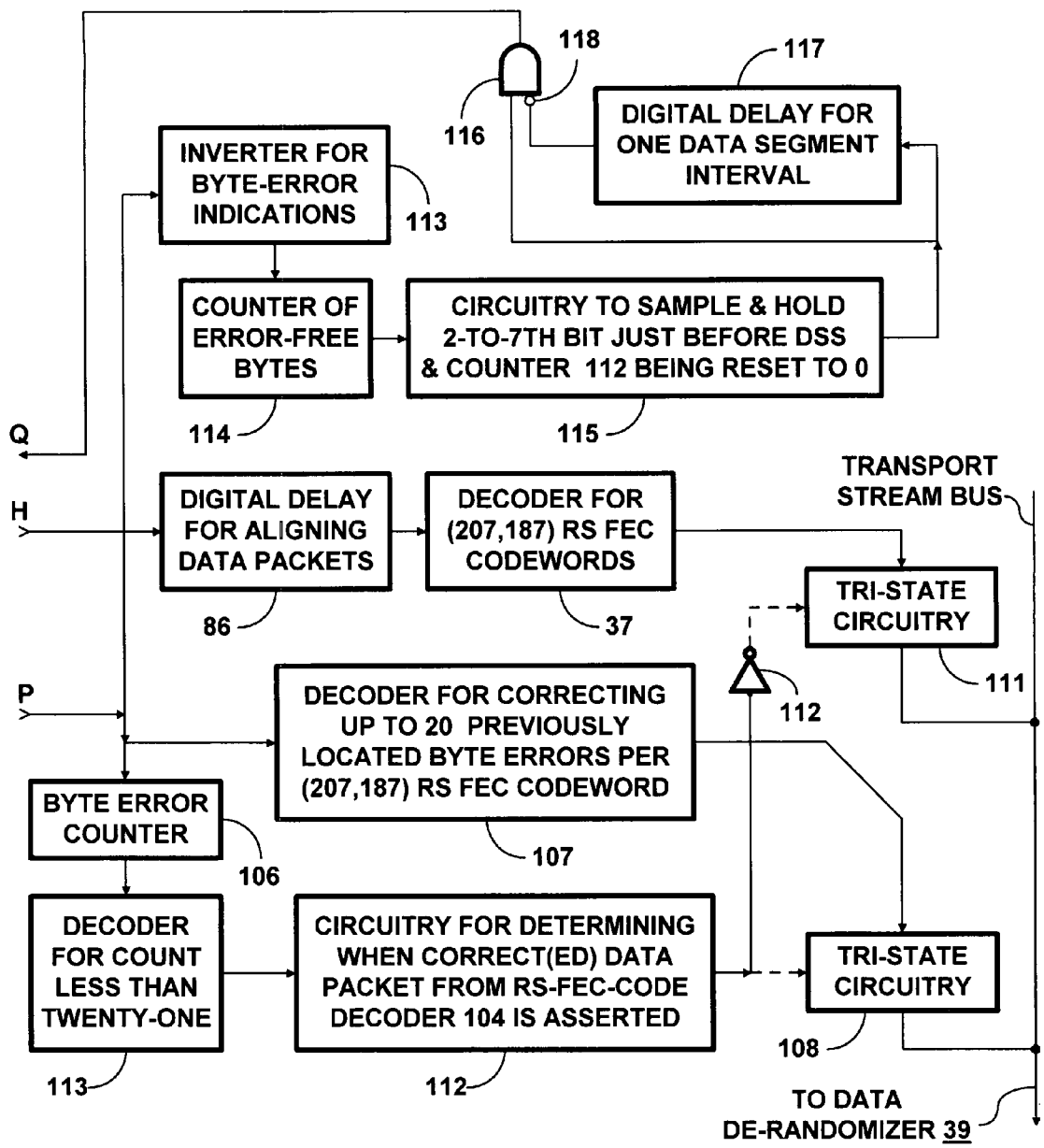

FIGS. 21A, 21B and 21C combine to form a FIG. 21 schematic diagram of a variant of the FIG. 20 triad decoder. The FIG. 21 triad decoder dispenses with the SIPO shift register 91 and suspends stage-to-stage shifting in the SIPO shift register 90 when the third data segment of a triad is being shifted into the SIPO shift register 89. Time-division multiplexing is used for parallel transfers from the stages of the SIPO shift register 90. After a data segment that is the third data segment of a triad has been shifted into the SIPO register 89, parallel transfer is from the stages of the SIPO shift register 90 corresponding to the stages of the SIPO shift register 91 from which parallel transfer was made in the FIG. 20 triad decoder. After a data segment that is the third data segment of a triad has been shifted into the SIPO register 89, parallel transfer is from the same stages of the SIPO shift register 90 from which parallel transfer was made in the FIG. 20 triad decoder.

More particularly, the FIG. 21C circuitry differs from the FIG. 20C circuitry only in that the parallel-transfer control circuitry 119 is not included. The AND gate 116 response is fed back through interconnections Q and R to the FIG. 21A circuitry, which differs from the FIG. 20A circuitry in that the SIPO shift register 91 is not included. The AND gate 116 response is applied as control signal to update control circuitry 121 that selectively withholds clocking signal from the SIPO shift register 90. The update control circuitry 121 withholds clocking signal from the SIPO shift register 90 when the AND gate 116 response is a ONE, so the contents of the register 90 are not shifted. The update control circuitry 121 forwards shift clocking signal to the SIPO shift register 90 when the AND gate 116 response is a ZERO, so the contents of the register 90 are shifted forward to make room for new contents being shifted in from the SIPO shift register 89.

The AND gate 116 response is also applied as control signal to a data bytes selector 122 and as control signal to a parity bytes selector 123. The AND gate 116 response is a ZERO when the SIPO shift register 89 contains the first or second data segment of a triad. The AND gate 116 response being ZERO conditions the data bytes selector 122 to select the first through 748th bits contained in the SIPO shift register 90 for parallel loading into the PISO shift register 92. The AND gate 116 response being ZERO conditions the parity bytes selector 123 to select the 1497th through 1576th bits contained in the SIPO shift register 90 for parallel loading into the PISO shift register 93. The bank 95 of complementors complements these 1497th through 1576th bits for parallel loading into the PISO shift register 94.

The AND gate 116 response is supposedly a ONE when the SIPO shift register 89 contains the third data segment of a triad. The AND gate 116 response being ONE conditions the data bytes selector 122 to select the 749th through 1496th bits contained in the SIPO shift register 90 for parallel loading into the PISO shift register 92. The AND gate 116 response being ONE conditions the parity bytes selector 123 to select the final eighty bits contained in the SIPO shift register 90 for parallel loading into the PISO shift register 93. The bank 95 of complementors complements these final eighty bits for parallel loading into the PISO shift register 94.

Figure 22:
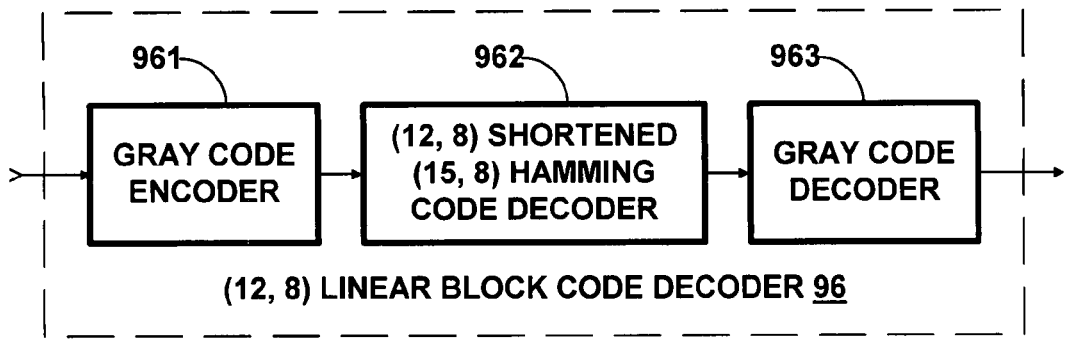
FIGS. 22, 23 and 24 are schematic diagrams showing preferred constructions of the (12, 8) linear block code decoders used in the FIG. 20B and FIG. 21B portions of DTV receivers.
Figure 23:
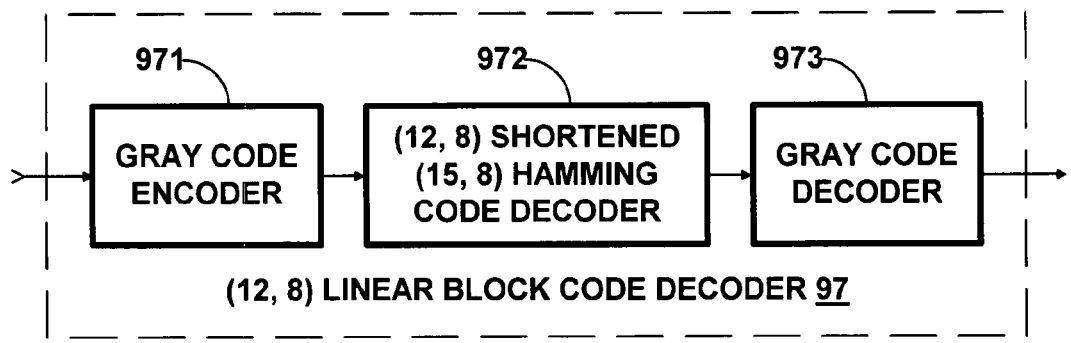
Figure 24:
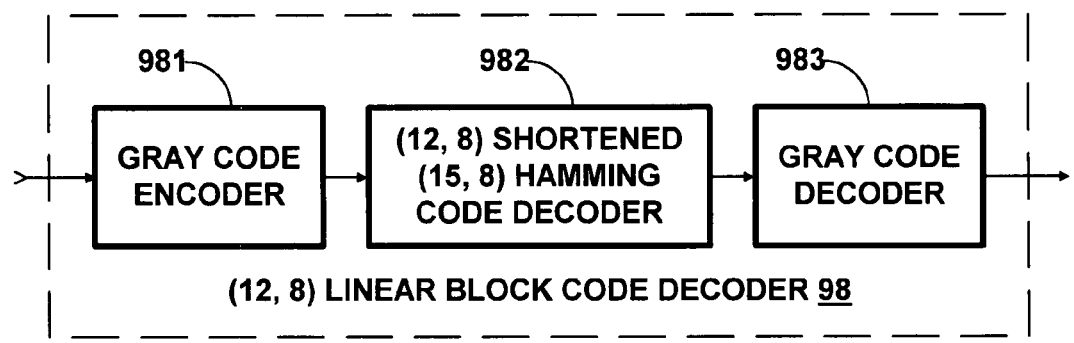

FIG. 22 shows details of the (12, 8) linear block code decoder 96 used in FIGS. 20B and 21B presuming that the (12, 8) LBC encoder 5 used in the DTV transmitter is of the type shown in FIG. 2. FIG. 22 shows the decoder 96 comprising a Gray code encoder 961, a decoder 962 for (12, 8) shortened (15, 8) Hamming code and a Gray code decoder 963, all in cascade connection. FIG. 23 shows details of the (12, 8) linear block code decoder 97 in FIGS. 20B and 21B presuming that the (12, 8) LBC encoder 5 used in the DTV transmitter is of the type shown in FIG. 2. FIG. 23 shows the decoder 97 comprising a Gray code encoder 971, a decoder 972 for (12, 8) shortened (15, 8) Hamming code and a Gray code decoder 973, all in cascade connection. FIG. 24 shows details of the (12, 8) linear block code decoder 98 in FIGS. 20B and 21B presuming that the (12, 8) LBC encoder 5 used in the DTV transmitter is of the type shown in FIG. 2. FIG. 24 shows the decoder 98 comprising a Gray code encoder 981, a decoder 982 for (12, 8) shortened (15, 8) Hamming code and a Gray code decoder 983, all in cascade connection. The extension bits indicating whether or not bytes are in error are supplied by the decoders 962, 972 and 982 for (12, 8) shortened (15, 8) Hamming code, bypassing the Gray code decoders 963, 973 and 983. This is so although FIGS. 22, 23 and 24 do not show these details. In practice, each of the (12, 8) LBC decoders 96, 97 and 98 will likely be constructed as a respective read-only memory.

In a modification of the FIG. 12 triad decoder, the further digital delay circuitry 88 is dispensed with, and the input signal for the (207, 187) RS-FEC-code decoder 37 is supplied instead from a properly located tap within the SIPO shift register 46. In a modification of the FIG. 20 triad decoder, the further digital delay circuitry 88 is dispensed with, and the input signal for the (207, 187) RS-FEC-code decoder 37 is supplied instead from a properly located tap within the SIPO shift register 90. Similar modification is not suitable for the FIG. 21 triad decoder, owing to the intermittent shift clocking of the SIPO shift register 90.

The inventor foresees improved DTV receivers will be developed in which the decoder 107 for correcting up to twenty previously located byte errors per (207, 187) R-S FEC codeword is replaced by a decoder capable of correcting an even greater number of previously located byte errors per (207, 187) R-S FEC codeword. A known type of decoder for R-S FEC code correlates each successive data segment with all possible (207, 187) R-S FEC codewords to determine the one(s) least distant from the data segment. Variants of this type of decoder can correlate each successive data segment with all possible (207, 187) R-S FEC codewords to determine the ones less distant from the data segment. The correlation procedures can have been done ahead of time for all possible 207-byte segments, with the results stored in a vast read-only memory (ROM). Then, the information concerning the locations of byte errors in the data segment is used to select the (207, 187) R-S FEC codeword that most probably was transmitted to cause the received data segment. Selection is based on the best correlation of possible (207, 187) R-S FEC codewords supplied from ROM with the bytes of the received data segment that the LBC decoder does not find to contain uncorrectable errors. Such types of improved decoder for R-S FEC code involve hardware or software that currently are too costly for inclusion in DTV receivers intended for use in the home. However, in time those costs may come down as technology advances. Such improved DTV receivers as rely on the byte errors in a (207, 187) R-S FEC codeword being previously located by an LBC decoder will embody the invention in an aspect thereof.

Any claim specifying that an RS decoder for (207, 187) Reed-Solomon forward-error-correction codewords is of a type for locating and correcting up to a certain number of erroneous bytes should be interpreted to include within its scope RS decoders with greater capability for locating and correcting erroneous bytes. Any claim specifying that an RS decoder for (207, 187) Reed-Solomon forward-error-correction codewords is of a type for correcting up to a certain number of erroneous bytes should be interpreted to encompass RS decoders with greater capability for correcting erroneous bytes.

One skilled in the art of digital electronics design will be enabled by acquaintance with the foregoing disclosure to design other variants of the system and its components This should be taken into consideration when considering the scope of the invention and the claims thereto. In particular, one skilled in the art of digital electronics design can design many variants of the temporary storage used when de-interleaving and decoding the symbols recovered from trellis decoding in the DTV receivers, which variants support de-interleaving and decoding procedures equivalent to those particularly described in the foregoing specification.

What is claimed is:

1. An 8VSB digital television signal transmitter for transmitting digital television signal on a carrier wave the modulation of which is responsive to a succession of consecutive fields of modulating signal, each said field of modulating signal being divided into a prescribed number of successive segments of modulating signal, each of said successive segments of modulating signal composed of a prescribed number of eight-modulation-level symbols, each segment of modulating signal beginning with a respective segment synchronizing sequence of common type, an initial one of said segments of each said field of modulating signal containing a respective field synchronization signal, at least most of all later segments of each said field of modulating signal concluding with eight-modulation-level symbols descriptive of a respective portion of one of a succession of convolutionally byte-interleaved data fields, each of said convolutionally byte-interleaved data fields being described within a respective one of said fields of modulating signal, each said data field being divisible into a prescribed number of successive data segments most composed of respective Reed-Solomon forward-error-correction codewords encoding respective data packets, pairs of some of said data segments that are composed of respective Reed-Solomon forward-error-correction codewords in ones of said data fields being grouped with another respective one of said data segments therein that contains parity bit information for linear block coding of eight-bit bytes of the Reed-Solomon forward-error-correction codewords with which it is grouped.

2. Additional encoding apparatus for inclusion in an 8VSB digital television signal transmitter of digital television signal on a carrier wave the modulation of which is responsive to a succession of consecutive fields of modulating signal, each said field of modulating signal being divided into a prescribed number of successive segments of modulating signal, each of said successive segments of modulating signal composed of a prescribed number of eight-modulation-level symbols, each segment of modulating signal beginning with a respective segment synchronizing sequence of common type, an initial one of said segments of each said field of modulating signal containing a respective field synchronization signal, at least most of all later segments of each said field of modulating signal concluding with eight-modulation-level symbols descriptive of a respective portion of one of a succession of convolutionally byte-interleaved data fields, each of said convolutionally byte-interleaved data fields being described within a respective one of said fields of modulating signal, each said data field being divisible into a prescribed number of successive data segments most composed of respective Reed-Solomon forward-error-correction codewords encoding respective data packets, pairs of some of said data segments that are composed of respective Reed-Solomon forward-error-correction codewords in ones of said data fields being grouped with another respective one of said data segments therein that contains parity bit information for linear block coding of eight-bit bytes of the Reed-Solomon forward-error-correction codewords with which it is grouped, said additional coding apparatus comprising:

a data randomizer connected for randomizing MPEG-2-compliant data packets;

a (207, 187) Reed-Solomon forward-error-correction encoder connected for generating (207, 187) Reed-Solomon codewords responsive to respective randomized MPEG-2-compliant data packets supplied from said data randomizer;

a (12, 8) linear-block-code encoder for encoding each eight-bit byte of at least selected pairs of said (207, 187) Reed-Solomon codewords to generate a respective twelve-bit (12, 8) linear-block-code word consisting of the original eight bits of said byte and an additional four bits of linear-block-code parity information; and an assembler of said groups of three data segments, a first of the data segments in each said group of three data segments containing the linear-block-code parity information for the eight-bit bytes of a second and a third of the data segments in each said group of three data segments, which said second and said third of the data segments in each said group of three data segments constitute a respective one of said selected pairs of said (207, 187) Reed-Solomon codewords.

3. An 8VSB digital television signal transmitter including additional encoding apparatus as specified in claim 2, wherein said consecutive data fields are each composed of one hundred four successive ones of said groups of three data segments, said 8VSB digital television signal transmitter further comprising:

a convolutional interleaver connected for receiving eight-bit bytes of said groups of three data segments received from said assembler and supplying a convolutionally interleaved set of those bytes as convolutional interleaver response;

a twelve-phase trellis coder connected for generating in its response a three-bit symbol responsive to each successive contiguous pair of bits in said convolutional interleaver response; and further transmitter apparatus connected for generating said digital television signal on a carrier wave, modulation of which carrier wave is arranged to be controlled by said response of said twelve-phase trellis coder.

4. The 8VSB digital television signal transmitter specified in claim 3, wherein said assembler includes apparatus for modifying in a prescribed way the first data segment of each of said groups of three data segments if and only if that first data segment could by mistake be misidentified as a correct or correctable (207, 187) Reed-Solomon codeword by a (207, 187) Reed-Solomon forward-error-correction decoder capable of locating and correcting up to ten erroneous bytes in a data segment with (207, 187) Reed-Solomon forward-error-correction coding, said prescribed way of modifying being of a type that prevents said mistake.

5. An 8VSB digital television signal transmitter as specified in claim 2, wherein portions of said consecutive data fields are composed of said groups of three data segments, said 8VSB digital television signal transmitter further comprising:

a time-division multiplexer connected for assembling data fields from said groups of three data segments and from other data segments;

a convolutional interleaver connected for receiving eight-bit bytes of said data fields assembled by said time-division multiplexer and supplying a convolutionally interleaved set of those bytes as convolutional interleaver response;

a twelve-phase trellis coder connected for generating in its response a three-bit symbol responsive to each successive contiguous pair of bits in said convolutional interleaver response; and further transmitter apparatus connected for generating said digital television signal on said carrier wave said modulation of which controlled by said response of said twelve-phase trellis coder.

6. The 8VSB digital television signal transmitter specified in claim 5, wherein said assembler includes apparatus for modifying in a prescribed way the first data segment of each of said groups of three data segments if and only if that first data segment could by mistake be misidentified as a correct or correctable (207, 187) Reed-Solomon codeword by a (207, 187) Reed-Solomon forward-error-correction decoder capable of locating and correcting up to ten erroneous bytes in a data segment with (207, 187) Reed-Solomon forward-error-correction coding, said prescribed way of modifying being of a type that prevents said mistake.

7. 8VSB digital television signal transmitter specified in claim 5, wherein said assembler includes apparatus for selectively complementing each and every one of the parity bits for linear block coding of each eight-bit parity byte of each said pair of said Reed-Solomon forward-error-correction coded data packets, said complementing being done when and only when necessary to cause the data segment containing those parity bits to appear to legacy digital television receivers to be a Reed-Solomon forward-error-correction codeword containing more than ten erroneous bytes.

8. The additional encoding apparatus of claim 2, wherein said (12, 8) linear-block-code encoder supplies (12, 8) linear block coding that is the equivalent of Gray coding followed by rearranged shortened (15, 11) Hamming coding followed by Gray decoding.

9. The additional encoding apparatus of claim 2, wherein the parity bits for linear block coding of each eight-bit parity byte of each said pair of said Reed-Solomon forward-error-correction coded data packets are all complemented, when and only when necessary to cause the data segment containing those parity bits to appear to legacy digital television receivers to be a Reed-Solomon forward-error-correction codeword containing more than ten erroneous bytes.

10. An 8VSB digital television signal receiver operable for performing the following method steps:

selecting a digital television signal on a carrier wave the modulation of which is responsive to a succession of consecutive fields of modulating signal, each said field of modulating signal being divided into a prescribed number of successive segments of modulating signal, each of said successive segments of modulating signal composed of a prescribed number of eight-modulation-level symbols, each segment of modulating signal beginning with a respective segment synchronizing sequence of common type, an initial one of said segments of each said field of modulating signal containing a respective field synchronization signal, and all later segments of each said field of modulating signal concluding with eight-modulation-level symbols descriptive of a respective portion of one of a succession of convolutionally byte-interleaved data fields, each of said convolutionally byte-interleaved data fields being described within a respective one of said fields of modulating signal, each said data field being divisible into a prescribed number of successive data segments most composed of respective Reed-Solomon forward-error-correction codewords encoding respective data packets, pairs of some of said data segments that are composed of respective Reed-Solomon forward-error-correction codewords in ones of said data fields being grouped with another respective one of said data segments therein that contains parity bit information for linear block coding of eight-bit bytes of the Reed-Solomon forward-error-correction codewords with which it is grouped;

demodulating said digital television signal on said carrier wave to obtain a baseband digital television signal, recovering said data fields from said baseband digital television signal, detecting which of said data fields as so recovered include ones of said pairs of data segments composed of respective Reed-Solomon forward-error-correction codewords that are grouped with respective other said data segments that contain parity bit information for linear block coding of eight-bit bytes of the Reed-Solomon forward-error-correction codeword with which they are grouped and utilizing the parity bit information of said linear block coding to improve decoding of associated ones of said Reed-Solomon forward-error-correction codewords under adverse reception conditions.

11. An 8VSB digital television signal receiver as specified in claim 10, comprising:

apparatus connected for supplying a digitized baseband 8VSB digital television signal responsive to the selected said 8VSB digital television signal on said carrier wave;

a twelve-phase trellis decoder connected for recovering ones of said succession of convolutionally byte-interleaved data fields in response to said digitized baseband 8VSB digital television signal;

a de-interleaver connected for de-interleaving bytes said ones of said succession of said convolutionally byte-interleaved data fields to recover successive data segments of successive ones of said data fields as de-interleaved;

a first RS decoder for (207, 187) Reed-Solomon forward-error-correction codewords connected to receive said successive data segments of said successive ones of said data fields as de-interleaved and for extracting respective randomized data packets therefrom to generate its response, said first RS decoder operable for locating and correcting up to ten erroneous bytes;

a triad decoder for said groups of three data segments connected to receive said successive data segments of said successive data fields as de-interleaved and for extracting respective randomized data packets from second and third data segments of each said group of three data segments to generate its triad decoder response;

a data packet selector connected for selecting correct randomized data packets from said triad decoder response and for selecting randomized data packets from the response of said first decoder for (207, 187) Reed-Solomon forward-error-correction codewords when correct randomized data packets are not available from said triad decoder response;

a data de-randomizer connected for supplying de-randomized data packets responsive to those randomized data packets selected by said data packet selector; and packet decoding apparatus connected for decoding correct ones of said de-randomized data packets.

12. An 8VSB digital television signal receiver as specified in claim 11, wherein said triad decoder comprises:

first, second and third 1656-bit shift registers having respective parallel-output ports, said first 1656-bit shift register having a serial-input port connected to receive successive data segments of said successive data fields as de-interleaved by said de-interleaver and having a serial-output port, said second 1656-bit shift register having a serial-input port connected to receive successive data segments of said successive data fields from said serial-output port of said first 1656-bit shift register and having a serial-output port, said third 1656-bit shift register having a serial-input port connected to receive successive data segments of said successive data fields from said serial-output port of said second 1656-bit shift register;

first and second 2244-bit shift registers having respective parallel-input ports and respective serial-output ports, the 749th to 2244th parallel-input ports of said first 2244-bit shift register receiving bits from the 161st to 1656th parallel-output ports of said first 1656-bit shift register respectively after each data segment is clocked into said first 1656-bit shift register and before a next data segment is clocked into said first 1656-bit shift register, the first to 748th parallel-input ports of said first 2244-bit shift register receiving bits from the 909th to 1656th parallel-output ports of said third 1656-bit shift register respectively after each data segment is clocked into said third 1656-bit shift register and before a next data segment is clocked into said third 1656-bit shift register, the 749th to 2244th parallel-input ports of said second 2244-bit shift register receiving bits from the 161st to 1656th parallel-output ports of said second 1656-bit shift register respectively after each data segment is clocked into said second 1656-bit shift register and before a next data segment is clocked into said second 1656-bit shift register, the first to 748th parallel-input ports of said second 2244-bit shift register receiving bits from the 161st to 908th parallel-output ports of said third 1656-bit shift register respectively after each data segment is clocked into said third 1656-bit shift register and before a next data segment is clocked into said third 1656-bit shift register;

first, second, third and fourth 240-bit shift registers having respective parallel-input ports and respective serial-output ports, the 81st to 240th parallel-input ports of said first 240-bit shift register receiving bits from the first to 160th parallel-output ports of said first 1656-bit shift register respectively after each data segment is clocked into said first 1656-bit shift register and before a next data segment is clocked into said first 1656-bit shift register, the first to 80th parallel-input ports of said first 240-bit shift register receiving bits from the 81st to 160th parallel-output ports of said third 1656-bit shift register respectively after each data segment is clocked into said third 1656-bit shift register and before a next data segment is clocked into said third 1656-bit shift register, the 81st to 240th parallel-input ports of said second 240-bit shift register receiving bits from the first to 160th parallel-output ports of said first 1656-bit shift register respectively after each data segment is clocked into said first 1656-bit shift register and before a next data segment is clocked into said first 1656-bit shift register, the first to 80th parallel-input ports of said second 240-bit shift register receiving complemented bits from the 81st to 160th parallel-output ports of said third 1656-bit shift register respectively after each data segment is clocked into said third 1656-bit shift register and before a next data segment is clocked into said third 1656-bit shift register, the 81st to 240th parallel-input ports of said third 240-bit shift register receiving bits from the first to $160^{th}$ parallel-output ports of said second 1656-bit shift register respectively after each data segment is clocked into said second 1656-bit shift register and before a next data segment is clocked into said second 1656-bit shift register, the first to 80th parallel-input ports of said third 240-bit shift register receiving bits from the first to 80th parallel-output ports of said third 1656-bit shift register respectively after each data segment is clocked into said third 1656-bit shift register and before a next data segment is clocked into said third 1656-bit shift register, the 81st to 240th parallel-input ports of said fourth 240-bit shift register receiving bits from the first to 160th parallel-output ports of said second 1656-bit shift register respectively after each data segment is clocked into said second 1656-bit shift register and before a next data segment is clocked into said second 1656-bit shift register, the first to 80th parallel-input ports of said fourth 240-bit shift register receiving complemented bits from the first to 80th parallel-output ports of said third 1656-bit shift register respectively after each data segment is clocked into said third 1656-bit shift register and before a next data segment is clocked into said third 1656-bit shift register;

first, second, third and fourth LBC decoders for said (12, 8) linear block coding, respectively connected for receiving twelve-bit codewords from said first 240-bit shift register, from said second 240-bit shift register, from said third 240-bit shift register and from said fourth 240-bit shift register, respectively—each of said first, said second, said third and said fourth LBC decoders being capable of signaling byte errors it detects but is unable to correct;

fifth and sixth LBC decoders for said (12, 8) linear block coding, respectively connected for receiving twelve-bit codewords from said first 2244-bit shift register and from said second 2244-bit shift register, respectively—both of said fifth and said sixth LBC decoders being capable of signaling byte errors it detects but is unable to correct;

second and third RS decoders for (207, 187) Reed-Solomon forward-error-correction codewords, each of said second and third RS decoders operable for correcting up to twenty previously located erroneous bytes in each (207, 187) Reed-Solomon forward-error-correction codeword and extracting a data packet therefrom as its response;

apparatus for combining decoding results generated in each data segment interval by said fifth LBC decoder with decoding results generated in each data segment interval by the one of said first and second LBC decoders with the least number of byte errors, thereby to furnish to said second RS decoder a possible (207, 187) Reed-Solomon forward-error-correction codeword together with indications of which bytes presumably contain respective errors;

apparatus for combining decoding results generated in each data segment interval by said sixth LBC decoder with decoding results generated in each data segment interval by the one of said third and fourth LBC decoders with the least number of byte errors, thereby to furnish to said third RS decoder a possible (207, 187) Reed-Solomon forward-error-correction codeword together with indications of which bytes presumably contain respective errors;

digital delay circuitry for generating a respective delayed data packet responsive to each data packet in said second RS decoder response;

a first byte error counter for counting the erroneous bytes in each possible (207, 187) Reed-Solomon forward-error-correction codeword supplied to said second RS decoder;

circuitry for determining, from the count of erroneous bytes in each possible (207, 187) Reed-Solomon forward-error-correction codeword supplied to said second RS decoder being less than twenty-one as determined by said first byte error counter, when a delayed data packet generated by said digital delay circuitry in delayed response to a respective data packet in said second RS decoder response is asserted as a correct packet in said triad decoder response;

a second byte error counter for counting the erroneous bytes in each possible (207, 187) Reed-Solomon forward-error-correction codeword supplied to said third RS decoder; and circuitry for determining, from the count of erroneous bytes in each possible (207, 187) Reed-Solomon forward-error-correction codeword supplied to said third RS decoder being less than twenty-one as determined by said second byte error counter, when a data packet in said third RS decoder response is asserted as a correct packet in said triad decoder response.

13. An 8VSB digital television signal receiver as specified in claim 12, wherein each of said first, said second, said third, said fourth, said fifth and said sixth LBC decoders is suitable for decoding (12, 8) linear block coding that is the equivalent of Gray coding followed by rearranged shortened (15, 11) Hamming coding followed by Gray decoding.

14. An 8VSB digital television signal receiver as specified in claim 11, wherein said triad decoder comprises:

first, second and third 1656-bit shift registers having respective parallel-output ports, said first 1656-bit shift register having a serial-input port connected to receive successive data segments of said successive data fields as de-interleaved by said de-interleaver and having a serial-output port, said second 1656-bit shift register having a serial-input port connected to receive successive data segments of said successive data fields from said serial-output port of said first 1656-bit shift register and having a serial-output port, said third 1656-bit shift register having a serial-input port connected to receive successive data segments of said successive data fields from said serial-output port of said second 1656-bit shift register;

a 2244-bit shift register having a parallel-input port and a serial-output port, during both a first mode of operation and a second mode of operation the 749th to 2244th parallel-input ports of said 2244-bit shift register receiving bits from the 161st to 1656th parallel-output ports of said first 1656-bit shift register respectively after each data segment is clocked into said first 1656-bit shift register and before a next data segment is clocked into said first 1656-bit shift register, only during said first mode of operation the first to 748th parallel-input ports of said 2244-bit shift register receiving bits from the 909th to 1656th parallel-output ports of said second 1656-bit shift register respectively after each data segment is clocked into said second 1656-bit shift register and before a next data segment is clocked into said second 1656-bit shift register, and only during said second mode of operation the first to 748th parallel-input ports of said 2244-bit shift register receiving bits from the 161st to 908th parallel-output ports of said third 1656-bit shift register respectively after each data segment is clocked into said third 1656-bit shift register and before a next data segment is clocked into said third 1656-bit shift register;

first and second 240-bit shift registers having respective parallel-input ports and respective serial-output ports, during both said first and said second modes of operation the 81st to 240th parallel-input ports of said first 240-bit shift register receiving bits from the first to 160th parallel-output ports of said first 1656-bit shift register respectively after each data segment is clocked into said first 1656-bit shift register and before a next data segment is clocked into said first 1656-bit shift register, during said first mode of operation the first to 80th parallel-input ports of said first 240-bit shift register receiving bits from the 81st to 160th parallel-output ports of said second 1656-bit shift register respectively after each data segment is clocked into said second 1656-bit shift register and before a next data segment is clocked into said second 1656-bit shift register, during said second mode of operation the first to 80th parallel-input ports of said first 240-bit shift register receiving bits from the first to 80th parallel-output ports of said third 1656-bit shift register respectively after each data segment is clocked into said third 1656-bit shift register and before a next data segment is clocked into said third 1656-bit shift register, during both said first and said second modes of operation the 81st to 240th parallel-input ports of said second 240-bit shift register receiving bits from the first to 160th parallel-output ports of said first 1656-bit shift register respectively after each data segment is clocked into said first 1656-bit shift register and before a next data segment is clocked into said first 1656-bit shift register, during said first mode of operation the first to 80th parallel-input ports of said second 240-bit shift register receiving complemented bits from the 81st to 160th parallel-output ports of said second 1656-bit shift register respectively after each data segment is clocked into said second 1656-bit shift register and before a next data segment is clocked into said second 1656-bit shift register, and during said second mode of operation the first to 80th parallel-input ports of said second 240-bit shift register receiving complemented bits from the first to 80th parallel-output ports of said third 1656-bit shift register respectively after each data segment is clocked into said third 1656-bit shift register and before a next data segment is clocked into said third 1656-bit shift register;

first and second LBC decoders for said (12, 8) linear block coding, respectively connected for receiving twelve-bit codewords from said first 240-bit shift register and from said second 240-bit shift register, respectively—each of said first and said second LBC decoders being capable of signaling byte errors it detects but is unable to correct;

a third LBC decoder for said (12, 8) linear block coding, connected for receiving twelve-bit codewords from said 2244-bit shift register—said third LBC decoder capable of signaling byte errors it detects but is unable to correct;

a second RS decoder of a type for correcting up to twenty previously located erroneous bytes in each (207, 187) Reed-Solomon forward-error-correction codeword and extracting a data packet therefrom as its response;

apparatus for combining decoding results generated in each data segment interval by said third LBC decoder with decoding results generated in each data segment interval by the one of said first and second LBC decoders with the least number of byte errors, thereby to furnish to said second RS decoder a possible (207, 187) Reed-Solomon forward-error-correction codeword together with indications of which bytes presumably contain respective errors;

circuitry for determining, from the number of erroneous bytes in each possible (207, 187) Reed-Solomon forward-error-correction codeword supplied to said second RS decoder being less than twenty-one, when a data packet in said second RS decoder response is asserted as a correct packet in said triad decoder response; and circuitry for determining from the number of erroneous bytes in each possible (207, 187) Reed-Solomon forward-error-correction codeword supplied to said second RS decoder being reduced from a large fraction of 207 in the previous codeword to a small fraction of 207 in the current codeword to replace the normal first mode of operation with the second mode of operation for processing a next codeword in the following data segment.

15. An 8VSB digital television signal receiver as specified in claim 14, wherein each of said first, said second, and said third LBC decoders is suitable for decoding (12, 8) linear block coding that is the equivalent of Gray coding followed by rearranged shortened (15, 11) Hamming coding followed by Gray decoding.

16. An 8VSB digital television signal receiver as specified in claim 11, wherein said triad decoder comprises:

first and second 1656-bit shift registers having respective parallel-output ports, said first 1656-bit shift register having a serial-input port connected to receive successive data segments of said successive data fields as de-interleaved by said de-interleaver and having a serial-output port, said second 1656-bit shift register having a serial-input port connected to receive successive data segments of said successive data fields from said serial-output port of said first 1656-bit shift register and having a serial-output port;

a 2244-bit shift register having a parallel-input port and a serial-output port, the 749th to 2244th parallel-input ports of said 2244-bit shift register receiving bits from the 161st to 1656th parallel-output ports of said first 1656-bit shift register respectively after each data segment is clocked into said first 1656-bit shift register and before a next data segment is clocked into said first 1656-bit shift register, the first to 748th parallel-input ports of said 2244-bit shift register receiving bits from the 909th to 1656th parallel-output ports of said second 1656-bit shift register respectively immediately after a data segment is clocked from said first 1656-bit shift register and entered into said second 1656-bit shift register, and the first to 748th parallel-input ports of said 2244-bit shift register receiving bits from the 161st to 908th parallel-output ports of said second 1656-bit shift register respectively immediately after a data segment is clocked from said first 1656-bit shift register but not entered into said second 1656-bit shift register;

first and second 240-bit shift registers having respective parallel-input ports and respective serial-output ports, the 81st to 240th parallel-input ports of said first 240-bit shift register receiving bits from the first to 160th parallel-output ports of said first 1656-bit shift register respectively after each data segment is clocked into said first 1656-bit shift register and before a next data segment is clocked into said first 1656-bit shift register, the first to 80th parallel-input ports of said first 240-bit shift register receiving bits from the 81st to 160th parallel-output ports of said second 1656-bit shift register respectively immediately after a data segment is clocked from said first 1656-bit shift register and entered into said second 1656-bit shift register, the first to 80th parallel-input ports of said first 240-bit shift register receiving bits from the first to 160th parallel-output ports of said second 1656-bit shift register respectively immediately after a data segment is clocked from said first 1656-bit shift register but not entered into said second 1656-bit shift register, the 81st to 240th parallel-input ports of said second 240-bit shift register receiving bits from the first to 160th parallel-output ports of said first 1656-bit shift register respectively immediately after a data segment is clocked into said first 1656-bit shift register, the first to 80th parallel-input ports of said second 240-bit shift register receiving complemented bits from the 81st to 160th parallel-output ports of said second 1656-bit shift register respectively immediately after a data segment is clocked from said first 1656-bit shift register and entered into said second 1656-bit shift register, the first to 80th parallel-input ports of said second 240-bit shift register receiving complemented bits from the first to 80th parallel-output ports of said second 1656-bit shift register respectively immediately after a data segment is clocked from said first 1656-bit shift register but not entered into said second 1656-bit shift register;

first and second LBC decoders for said (12, 8) linear block coding, respectively connected for receiving twelve-bit codewords from said first 240-bit shift register and from said second 240-bit shift register, respectively—each of said first and said second LBC decoders being capable of signaling byte errors it detects but is unable to correct;

a third LBC decoder for said (12, 8) linear block coding, connected for receiving twelve-bit codewords from said 2244-bit shift register—said third LBC decoder capable of signaling byte errors it detects but is unable to correct;

a second RS decoder of a type for correcting up to twenty previously located erroneous bytes in each (207, 187) Reed-Solomon forward-error-correction codeword and extracting a data packet therefrom as its response;

apparatus for combining decoding results generated in each data segment interval by said third LBC decoder with decoding results generated in each data segment interval by the one of said first and second LBC decoders with the least number of byte errors, thereby to furnish to said second RS decoder a possible (207, 187) Reed-Solomon forward-error-correction codeword together with indications of which bytes presumably contain respective errors;

circuitry for determining, from the number of erroneous bytes in each possible (207, 187) Reed-Solomon forward-error-correction codeword supplied to said second RS decoder being less than twenty-one, when a data packet in said second RS decoder response is asserted as a correct packet in said triad decoder response; and circuitry for determining from the number of erroneous bytes in each possible (207, 187) Reed-Solomon forward-error-correction codeword supplied to said second RS decoder being reduced from a large fraction of 207 in the previous codeword to a small fraction of 207 in the current codeword to hold the contents stored in said second 1656-bit shift register and prevent entry of said current codeword into said second 1656-bit shift register from said first 1656-bit shift register.

17. An 8VSB digital television signal receiver as specified in claim 16, wherein each of said first, said second, and said third LBC decoders is suitable for decoding (12, 8) linear block coding that is the equivalent of Gray coding followed by rearranged shortened (15, 11) Hamming coding followed by Gray decoding.

* * * * *